US010854797B2

(12) United States Patent
Kitamura et al.

(10) Patent No.: US 10,854,797 B2
(45) Date of Patent: *Dec. 1, 2020

(54) PHOTON EXTRACTION FROM ULTRAVIOLET LIGHT-EMITTING DEVICES

(71) Applicants:Ken Kitamura, Tokyo (JP); Masato Toita, Tokyo (JP); Hironori Ishii, Tokyo (JP); Yuting Wang, Tokyo (JP); Leo J. Schowalter, Latham, NY (US); Jianfeng Chen, Troy, NY (US); James R. Grandusky, Waterford, NY (US)

(72) Inventors: Ken Kitamura, Tokyo (JP); Masato Toita, Tokyo (JP); Hironori Ishii, Tokyo (JP); Yuting Wang, Tokyo (JP); Leo J. Schowalter, Latham, NY (US); Jianfeng Chen, Troy, NY (US); James R. Grandusky, Waterford, NY (US)

(73) Assignee: CRYSTALIS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,716

(22) Filed: May 24, 2019

(65) Prior Publication Data

US 2019/0348581 A1   Nov. 14, 2019

Related U.S. Application Data

(63) Continuation of application No. 15/898,347, filed on Feb. 16, 2018, now Pat. No. 10,347,805, which is a
(Continued)

(51) Int. Cl.
*H01L 33/56* (2010.01)
*H01L 33/58* (2010.01)
*H01L 33/54* (2010.01)

(52) U.S. Cl.
CPC .............. *H01L 33/56* (2013.01); *H01L 33/54* (2013.01); *H01L 33/58* (2013.01); *H01L 2933/005* (2013.01); *H01L 2933/0058* (2013.01)

(58) Field of Classification Search
CPC ... H01L 33/54; H01L 33/58; H01L 2933/005; H01L 2933/0058
See application file for complete search history.

(56) References Cited

U.S. PATENT DOCUMENTS 6,172,752 B1   1/2001   Haruna et al.
6,921,929 B2   7/2005   LeBoeuf
(Continued)

FOREIGN PATENT DOCUMENTS

JP   2012-109461 A    6/2012
KR   10-2013-0072990 A   7/2013
KR   10-2013-0104944 A   9/2013

OTHER PUBLICATIONS

International Search Report and Written Opinion issued in a corresponding International Application No. PCT/US2015/041689 dated Nov. 19, 2015.

*Primary Examiner* — Savitri Mulpuri
(74) *Attorney, Agent, or Firm* — Morgan, Lewis & Bockius LLP

(57) ABSTRACT

In various embodiments, a layer of organic encapsulant is provided over a surface of an ultraviolet (UV) light-emitting semiconductor die, and at least a portion of the encapsulant is exposed to UV light to convert at least some of said portion of the encapsulant into non-stoichiometric silica material. The non-stoichiometric silica material includes silicon, oxygen, and carbon, and a carbon content of the non-stoichiometric silica material is greater than 1 ppm and less than 40 atomic percent.

28 Claims, 20 Drawing Sheets

Related U.S. Application Data continuation of application No. 14/806,761, filed on Jul. 23, 2015, now Pat. No. 9,935,247.

(60) Provisional application No. 62/027,968, filed on Jul. 23, 2014.

(56) References Cited

U.S. PATENT DOCUMENTS

| | | |
|---|---|---|
| 7,443,609 B2 | 10/2008 | Yoon et al. |
| 7,635,603 B2 | 12/2009 | Yang et al. |
| 7,832,885 B2 | 11/2010 | Hsiao et al. |
| 7,902,566 B2 | 3/2011 | Paolini et al. |
| 7,943,952 B2 | 5/2011 | Loh et al. |
| 8,134,165 B2 | 3/2012 | Lee et al. |
| 8,294,160 B2 | 10/2012 | Suehior |
| 8,962,359 B2 | 2/2015 | Schowalter et al. |
| 9,065,072 B2 | 6/2015 | Song et al. |
| 9,315,674 B2 | 4/2016 | Schmidt et al. |
| 9,935,247 B2 | 4/2018 | Kitamura et al. |
| 2002/0030194 A1 | 3/2002 | Camras et al. |
| 2003/0094664 A1 | 5/2003 | Yagi |
| 2003/0152803 A1 | 8/2003 | Acchione |
| 2005/0072981 A1 | 4/2005 | Suenaga |
| 2006/0138443 A1 | 6/2006 | Fan et al. |
| 2007/0101932 A1 | 5/2007 | Schowalter et al. |
| 2008/0023719 A1 | 1/2008 | Camras et al. |
| 2008/0179620 A1 | 7/2008 | Chang |
| 2009/0065792 A1 | 3/2009 | Thompson et al. |
| 2009/0072263 A1 | 3/2009 | Paolini et al. |
| 2009/0076184 A1 | 3/2009 | Thompson et al. |
| 2009/0270526 A1 | 10/2009 | Liu et al. |
| 2009/0321758 A1 | 12/2009 | Liu et al. |
| 2010/0148666 A1 | 6/2010 | Liu et al. |
| 2010/0207132 A1 | 8/2010 | Lee et al. |
| 2011/0062469 A1 | 3/2011 | Camras et al. |
| 2011/0303940 A1 | 12/2011 | Lee et al. |
| 2012/0007119 A1 | 1/2012 | Shiobara et al. |
| 2013/0214298 A1 | 8/2013 | Lin et al. |
| 2014/0159567 A1 | 6/2014 | Li et al. |
| 2014/0203311 A1 | 6/2014 | Schowalter et al. |
| 2014/0320770 A1 | 10/2014 | Motohashi et al. |
| 2016/0027975 A1 | 1/2016 | Kitamura et al. |
| 2018/0190883 A1 | 7/2018 | Kitamura et al. |

| CASE # | ENCAPSULANT THICKNESS | LENS | LENS DIAMETER | CYLINDER HEIGHT | PHOTON EXTRACTION EFFICIENCY | FAR FIELD FWHM |
|---|---|---|---|---|---|---|
| 1 | N/A | N/A | N/A | N/A | 1.0X | 120° |
| 2 | 170μm | FUSED SILICA | 2mm | 0 | 2.2X | 87° |
| 3 | 10μm | FUSED SILICA | 2mm | 0 | 2.2X | 114° |
| 4 | 10μm | FUSED SILICA | 2mm | 0.5mm | 2.2X | 70° |
| 5 | 10μm | FUSED SILICA | 2mm | 1.0mm | 1.9X | 50° |
| 6 | 10μm | FUSED SILICA | 3mm | 1.0mm | 2.3X | 48° |
| 7 | 10μm | FUSED SILICA | 3mm | 1.5mm | 1.9X | 32° |
| 8 | 10μm | FUSED SILICA | 4mm | 1.6mm | 2.2X | 40° |
| 9 | 10μm | FUSED SILICA | 4mm | 1.9mm | 2.0X | 25° |

FIG. 9

PHOTON EXTRACTION FROM ULTRAVIOLET LIGHT-EMITTING DEVICES

RELATED APPLICATION

This application is a continuation of U.S. patent application Ser. No. 15/898,347, filed Feb. 16, 2018, which is a continuation of U.S. patent application Ser. No. 14/806,761, filed Jul. 23, 2015, which claims the benefit of and priority to U.S. Provisional Patent Application No. 62/027,968, filed Jul. 23, 2014, the entire disclosure of each of which is hereby incorporated herein by reference.

TECHNICAL FIELD

In various embodiments, the present invention relates to light emitters emitting ultraviolet (UV) radiation.

BACKGROUND

The output powers, efficiencies, and lifetimes of short-wavelength ultraviolet light-emitting diodes (UV LEDs), i.e., LEDs that emit light at wavelengths less than 350 nm, based on the nitride semiconductor system remain limited due to high defect levels in the active region. These limitations are particularly problematic (and notable) in devices designed to emit at wavelengths less than 270 nm. Most development effort has been carried out on devices formed on foreign substrates such as sapphire where defect densities remain high despite innovative defect reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of short-wavelength UV LEDs has low wall-plug efficiencies (WPEs) of, at best, only a few percent, where WPE is defined as the ratio of usable optical power (in this case, emitted UV light) achieved from the diode divided by the electrical power into the device. The WPE of an LED may be calculated by taking the product of the electrical efficiency ($\eta_{el}$), the photon extraction efficiency ($\eta_{ex}$), and the internal efficiency (IE); i.e., WPE=$\eta_{el}$×$\eta_{ex}$×IE. The IE itself is the product of current injection efficiency ($\eta_{inj}$) and the internal quantum efficiency (IQE); i.e., IE=$\eta_{inj}$×IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues may contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. Additionally, UV LEDs suffer because approximately half of the generated photons are directed toward the p-contact and absorbed by the p-GaN of that contact. Even when photons are directed toward the AlN surface, only about 9.4% generally escape from an untreated surface due to the large index of refraction of the AlN, which results in a small escape cone. Additional photons are lost on their way to the exit surface due to absorption in the AlN substrate. These losses are multiplicative and the average photon extraction efficiency is only about 2.5%.

In typical LED fabrication, the large difference in the index of refraction between the LED structure and air (and resulting lack of photon extraction) may be greatly ameliorated by using an encapsulant with an intermediate index of refraction. Specifically, many conventional designs feature a "dome" of the encapsulant material disposed over and at least partially surrounding the LED (and subsequently cured by a thermal treatment). The encapsulation increases the critical angle of total internal reflection through the top surface of the semiconductor die, which has led to significant improvements in photon-extraction efficiency for visible LEDs.

Unfortunately, LED encapsulants and adhesives may be easily damaged by UV radiation, leading to degradation of the encapsulant or adhesive. The degradation is particularly severe with exposure to UVC radiation (i.e., radiation at wavelengths less than 300 nm). Thus, using an encapsulant to improve photon extraction is typically ineffective with UV LEDs. Moreover, although UV-resistant encapsulants have been developed, even these compounds exhibit degradation upon exposure to UV light far less than the desired service lifetime of UV LEDs. For example, the Deep UV-200 encapsulant available from Schott North America, Inc. of Elmsford, N.Y., exhibits a 15% drop in transmittance for 300 nm light after only 1000 hours of exposure.

Thus, there is a need for an easily implementable approach to effectively increase the photon-extraction efficiency from UV LEDs that overcomes the lack of stable encapsulants that are transparent to UV radiation, particularly UVC radiation. Such an approach would desirably enable high transmittance and reliability of UV LEDs without significant degradation over the intended service lifetime of these devices, e.g., approximately 10,000 hours or even longer.

SUMMARY

In various embodiments of the present invention, the photon-extraction efficiency of UV light-emitting devices such as UV LEDs is improved via attachment of an inorganic (and typically rigid) lens directly to the LED die using a thin layer of an encapsulant (e.g., an organic compound). In some embodiments, the encapsulant is a liquid or gel, e.g., silicone oil and/or silicone resin. The lens typically includes, consists essentially of, or consists of a UV-transparent (at least UVC-transparent) material such as sapphire, fused silica, or quartz. Other lens materials may be utilized, e.g., materials having an index of refraction greater than 1.3 and that are transparent and stable during exposure to high intensity short-wavelength UV radiation. Utilization of the lens results in at least a doubling (and even up to 2.6× or even larger increases) in the extracted quasi-continuous-wave output power of UV LEDs. In addition, the far field pattern (FWHM) of the devices may be narrowed by at least 20%. The lens is preferably shaped to minimize the amount of radiation which will undergo total internal reflection. Typically, this will be a round or hemispherical shape, although other shapes fall within the scope of the present invention. In various embodiments, the lens shape has a cylindrical component and a hemispherical component in order to, e.g., narrow the far field pattern. In other embodiments, the lens includes, consists essentially of, or consists of a substantially flat plate or a flat plate that has been patterned or textured to enhance light extraction therefrom. For example, the flat plate may be patterned to form a Fresnel lens to improve photon extraction for photons that are approaching the surface at a large angle.

Various embodiments of the invention incorporate an organic encapsulant that degrades upon initial exposure to UV light; in particular, such organic encapsulants may experience partial oxidation when exposed to UV light (e.g., during an initial period of light emission by the device), altering the refractive index of the encapsulant and/or forming small localized areas from which light from the device die scatters, decreasing the amount of UV light reaching the lens and ultimately being emitted therefrom. In accordance with various embodiments of the invention, such encapsulants are surprisingly and advantageously at least partially converted to a non-stoichiometric silica material via additional exposure to UV light, improving their output characteristics. Specifically, the carbon content of the encapsulant diminishes to, for example, approximately 40 atomic % or less, approximately 30 atomic % or less, or even approximately 20 atomic % or less as the encapsulant is at least partially converted into the non-stoichiometric silica material during this initial "burn-in" period of exposure to UV light, and afterward the transmissivity of the encapsulant improves considerably and is robust for at least thousands of hours of operation of the device. In various embodiments, the carbon content of the encapsulant after conversion into the non-stoichiometric silica material is approximately 5 atomic % or larger, approximately 10 atomic % or larger, or approximately 15 atomic % or larger. Thus, in accordance with various embodiments of the present invention, the converted encapsulant is substantially immune to further UV-induced decreases in transmissivity after being exposed to UV light for an initial period (e.g., up to approximately 200 hours, up to approximately 300 hours, or between approximately 100 hours and approximately 200-300 hours). In accordance with various embodiments of the invention, the non-stoichiometric silica material includes, consists essentially of, or even consists of silicon, oxygen, and carbon, where the carbon content is greater than 1 ppm (and typically greater than 1 atomic %) and approximately 30 atomic % or less, or even approximately 20 atomic % or less. With long exposures to the UV light, the composition of the non-stoichiometric silica material approaches that of pure silica, but small amounts of carbon may be detectable via characterization methods such as secondary ion mass spectroscopy (SIMS).

Embodiments of the present invention utilize UV light having a wavelength selected from the range of approximately 100 nm to approximately 400 nm. Preferred embodiments utilize UVC light having a wavelength selected from the range of approximately 100 nm to approximately 280 nm, or, even more preferably, approximately 210 nm to approximately 280 nm. Other embodiments utilize UVA light (i.e., light having a wavelength selected from the range of approximately 315 nm to approximately 400 nm) or UVB light (i.e., light having a wavelength selected from the range of approximately 280 nm to approximately 315 nm).

In some embodiments, the conversion of the encapsulant embrittles the encapsulant, and thus the lens may be more likely to loosen or become detached from the light-emitting die. In such embodiments, an additional attachment agent may be utilized to further secure the lens in contact with the die. For example, the attachment agent may be a resin (e.g., an epoxy resin that may be opaque) in which the device is partially immersed. The resin preferably extends at least slightly (e.g., about 0.3 mm or less) above the interface between the die (or the embrittled encapsulant) and the lens in order to further stabilize the lens during device operation and handling. In various embodiments, the attachment agent may include, consist essentially of, or consist of an opaque resin (and/or other barrier layer) described in U.S. patent application Ser. No. 14/679,655, filed on Apr. 6, 2015 (the '655 application), the entire disclosure of which is incorporated by reference herein. The attachment agent and/or barrier layer substantially prevents transmission of UV light through the majority of such encapsulant, thereby preventing deterioration and cracking (or other mechanical failure) thereof. In various embodiments of the invention, the attachment agent and/or barrier layer includes, consists essentially of, or consists of a portion of the encapsulant itself that is adjacent to the LED chip and opaque to the UV light emitted by the LED chip. (In such embodiments, the remaining portion of the encapsulant farther away from the LED chip may also be UV-opaque or transparent, as this more distant encapsulant will typically not transmit the emitted UV light.) As utilized herein, an "opaque" material substantially does not transmit light of a particular wavelength or wavelength range (e.g., UV light), and instead is reflective and/or strongly absorptive (e.g., over a small thickness) to light of the particular wavelength or wavelength range. In other embodiments of the invention, the barrier layer includes, consists essentially of, or consists of a solid opaque shield disposed between the LED chip and the encapsulant, which may itself therefore be transparent or opaque to UV light. For example, the shield may be composed of a metal that is substantially reflective to UV light such as aluminum. In this manner, embodiments of the invention include packaged UV LEDs having long lifetimes, high output power, and high reliability.

In an aspect, embodiments of the invention feature a method of assembling and burning in an illumination device. A layer of an organic encapsulant is provided over a surface of an ultraviolet (UV) light-emitting semiconductor die. At least a portion of the encapsulant is exposed to UV light to convert at least some of said portion of the encapsulant into non-stoichiometric silica material. The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The exposure to UV light may precede nominal device operation (i.e., device operation by a customer and/or within a larger device, and/or device operation at a current level, operating temperature, and/or oxygen content in the ambient surrounding the device that are "nominal," i.e., recommended for normal operation based on the design and structure of the device). The UV light to which the encapsulant is exposed may be emitted by the semiconductor die and, during at least a portion of the exposure, the semiconductor die may be operated at a current level different from (e.g., higher than or lower than) the nominal current level, at an operating temperature different from (e.g., higher than or lower than) the nominal operating temperature, and/or within a surrounding ambient containing an oxygen content different from (e.g., higher than or lower than) the nominal oxygen content. The exposure to UV light may precede packaging of the device (e.g., for shipment) and/or shipment to a customer. The exposure to UV light may precede placement of the device within or on a larger system that utilizes the UV light emitted by the semiconductor die (e.g., for cutting, imaging, disinfection, etc.). The device may emit UV light at an initial output power before and/or immediately upon exposure of the encapsulant to the UV light, and the output power may decrease to a minimum value (i.e., a value lower than the initial value) and recover to a final value close to (i.e., approximately 70% to approximately 100% of) the initial value. The encapsulant may be exposed to the UV light for at least a time period sufficient for the output power of the device to recover to the final value. The exposure of the encapsulant to UV light may result in the formation of a gaseous byproduct (e.g., formaldehyde) from the encapsulant and/or the diffusion of the gaseous byproduct out of the encapsulant. The encapsulant may be exposed to the UV light for at least a time period sufficient for the formation and/or diffusion of the gaseous byproduct to substantially cease (e.g., be undetectable). The exposure of the encapsulant to UV light may result in a reduction of the carbon content of the encapsulant. The encapsulant may be exposed to the UV light for at least a time period sufficient for the carbon content of the encapsulant to drop to approximately 40 atomic percent or less, approximately 30 atomic percent or less, approximately 20 atomic percent or less, approximately 10 atomic percent or less, approximately 5 atomic percent or less, or even approximately 1 atomic percent or less.

The wavelength of the UV light to which the encapsulant is exposed may be the same as the wavelength of UV light emitted by the semiconductor die. The wavelength of the UV light to which the encapsulant is exposed may be different from the wavelength of UV light emitted by the semiconductor die. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. A rigid lens may be disposed on the encapsulant opposite the semiconductor die. The rigid lens may be inorganic. The rigid lens may include, consist essentially of, or consist of fused silica, quartz, and/or sapphire. An attachment material may be disposed around at least a portion of the semiconductor die and around at least a portion of the rigid lens. The attachment material may include, consist essentially of, or consist of a resin. The attachment material may be opaque to UV light. A top surface of the attachment material may be disposed above a bottom surface of the rigid lens by no more than 0.5 mm. A top surface of the attachment material may be disposed above a bottom surface of the rigid lens by no more than 0.3 mm. The rigid lens may be attached to the semiconductor die via application of a force sufficient to minimize a thickness of the encapsulant between the rigid lens and the semiconductor die. After attachment of the rigid lens, the thickness of the encapsulant may be insufficient to prevent propagation of thermal expansion mismatch-induced strain between the rigid lens and the semiconductor die. After attachment of the rigid lens, the thickness of the encapsulant may be approximately 10 μm or less, approximately 8 μm or less, or even approximately 5 μm or less. The rigid lens may be at least partially hemispherical. The rigid lens may be substantially hemispherical. The rigid lens may have a substantially hemispherical portion and a substantially cylindrical portion disposed thereunder. The rigid lens may be a flat plate. At least a portion of a top surface of the rigid lens may be patterned and/or textured to enhance light emission therefrom.

The encapsulant may include, consist essentially of, or consist of silicone before the exposure to UV light. The encapsulant may include, consist essentially of, or consist of silicone oil or silicone resin before the exposure to UV light. Before exposure to UV light the encapsulant may have a carbon content greater than 40 atomic percent. After exposure to UV light the non-stoichiometric silica material may have a carbon content less than 30 atomic percent. A barrier may be disposed between the semiconductor die and at least a portion of the encapsulant. The barrier may include, consist essentially of, or consist of a material opaque to UV light. The barrier may include, consist essentially of, or consist of a resin opaque to UV light. The barrier may include, consist essentially of, or consist of a material reflective to UV light. The barrier may include, consist essentially of, or consist of aluminum and/or polytetrafluoroethylene. The semiconductor die may be a light-emitting diode die or a laser die. The at least a portion of the encapsulant may be exposed to UV light for a period of approximately 50 hours to approximately 500 hours, a period of approximately 100 hours to approximately 400 hours, a period of approximately 100 hours to approximately 300 hours, a period of approximately 200 hours to approximately 300 hours, or a period of approximately 200 hours. The at least a portion of the encapsulant may be exposed to UV light emitted by the semiconductor die. At least a portion of the UV light to which the at least a portion of the encapsulant is exposed may be emitted by a device other than the semiconductor die (e.g., a different light-emitting semiconductor die, a UV lamp, etc.). The at least a portion of the encapsulant may be exposed to UV light emitted by both the semiconductor die and a device other than the semiconductor die. The at least a portion of the encapsulant may be exposed to UV light having a wavelength selected from the range of approximately 210 nm to approximately 280 nm (e.g., approximately 250 nm to approximately 270 nm).

In another aspect, embodiments of the invention feature an illumination device that includes or consists essentially of an ultraviolet (UV) light-emitting semiconductor die, a rigid lens for extracting light from the light-emitting semiconductor die, and a layer of encapsulant disposed between the rigid lens and the light-emitting semiconductor die. At least a portion of the layer of encapsulant includes, consists essentially of, or consists of an organic material converted into a non-stoichiometric silica material by exposure to UV light. The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. The at least a portion of the layer of encapsulant may include, consist essentially of, or consist of an organic material converted into a non-stoichiometric silica material by exposure to UV light having a wavelength selected from the range of approximately 210 nm to approximately 280 nm.

In yet another aspect, embodiments of the invention feature an illumination device that includes or consists essentially of an ultraviolet (UV) light-emitting semiconductor die, a rigid lens for extracting light from the light-emitting semiconductor die, and a layer of non-stoichiometric silica material disposed between the rigid lens and the light-emitting semiconductor die. The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The layer of non-stoichiometric silica material may be a portion of and/or disposed within, a layer of an organic encapsulant (e.g., an encapsulant including, consisting essentially of, or consisting of silicone). The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent.

In another aspect, embodiments of the invention feature an illumination device that includes or consists essentially of an ultraviolet (UV) light-emitting semiconductor die, and a layer of encapsulant disposed over and/or around the semiconductor die. At least a portion of the layer of encapsulant includes, consists essentially of, or consists of an organic material converted into a non-stoichiometric silica material by exposure to UV light. The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The layer of encapsulant may have the shape of a lens. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. The layer of encapsulant may be disposed over a top surface of the semiconductor die. A barrier material may be disposed proximate a sidewall of the semiconductor die. The barrier material may be opaque to UV light. The barrier material may include, consist essentially of, or consist of an opaque resin, aluminum, and/or polytetrafluoroethylene. The at least a portion of the layer of encapsulant may include, consist essentially of, or consist of an organic material converted into a non-stoichiometric silica material by exposure to UV light having a wavelength selected from the range of approximately 210 nm to approximately 280 nm.

In yet another aspect, embodiments of the invention feature an illumination device that includes or consists essentially of an ultraviolet (UV) light-emitting semiconductor die and a layer of non-stoichiometric silica material disposed over and/or around the semiconductor die. The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. The layer of non-stoichiometric silica material may be disposed over a top surface of the semiconductor die. A barrier material may be disposed proximate a sidewall of the semiconductor die. The barrier material may be opaque to UV light. The barrier material may include, consist essentially of, or consist of an opaque resin, aluminum, and/or polytetrafluoroethylene.

In another aspect, embodiments of the invention feature an illumination device that includes or consists essentially of an ultraviolet (UV) light-emitting semiconductor die and a layer of encapsulant disposed over and/or around the semiconductor die. A first portion of the layer of encapsulant includes, consists essentially of, or consists of an organic material at least partially converted into a non-stoichiometric silica material by exposure to UV light. A second portion of the layer of encapsulant includes, consists essentially of, or consists of an organic encapsulant (e.g., silicone). The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The first portion of the layer of encapsulant may include, consist essentially of, or consist of an organic material at least partially converted into a non-stoichiometric silica material by exposure to UV light having a wavelength selected from the range of approximately 210 nm to approximately 280 nm. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. The first portion of the layer of encapsulant may be disposed over a top surface of the semiconductor die. The second portion of the layer of encapsulant may be disposed proximate a sidewall of the semiconductor die. The second portion of the layer of encapsulant may be disposed over the top surface of the semiconductor die and farther away from the top surface of the semiconductor die than the first portion of the layer of encapsulant. The first portion of the layer of encapsulant may be disposed within, and/or at least partially surrounded by, the second portion of the layer of encapsulant. A barrier material may be disposed between the sidewall of the semiconductor die and the second portion of the layer of encapsulant. The barrier material may be opaque to UV light. The barrier material may include, consist essentially of, or consist of aluminum, polytetrafluoroethylene, and/or an opaque resin.

In yet another aspect, embodiments of the invention feature an illumination device that includes or consists essentially of an ultraviolet (UV) light-emitting semiconductor die and a layer of encapsulant disposed over and/or around the semiconductor die. A first portion of the layer of encapsulant includes, consists essentially of, or consists of a non-stoichiometric silica material. A second portion of the layer of encapsulant includes, consists essentially of, or consists of an organic encapsulant (e.g., silicone). The non-stoichiometric silica material includes, consists essentially of, or consists of silicon, oxygen, and carbon. A carbon content of the non-stoichiometric silica material is greater than 1 ppm and less than 40 atomic percent.

Embodiments of the invention may include one or more of the following in any of a variety of combinations. The carbon content of the non-stoichiometric silica material may be greater than 1 atomic percent. The carbon content of the non-stoichiometric silica material may be less than 30 atomic percent, less than 20 atomic percent, less than 10 atomic percent, or even less than 5 atomic percent. The first portion of the layer of encapsulant may be disposed over a top surface of the semiconductor die. The second portion of the layer of encapsulant may be disposed proximate a sidewall of the semiconductor die. The second portion of the layer of encapsulant may be disposed over the top surface of the semiconductor die and farther away from the top surface of the semiconductor die than the first portion of the layer of encapsulant. The first portion of the layer of encapsulant may be disposed within, and/or at least partially surrounded by, the second portion of the layer of encapsulant. A barrier material may be disposed between the sidewall of the semiconductor die and the second portion of the layer of encapsulant. The barrier material may be opaque to UV light. The barrier material may include, consist essentially of, or consist of aluminum, polytetrafluoroethylene, and/or an opaque resin.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 9 is a table of photon extraction efficiencies and far field patterns as functions of lens dimensions and encapsulant thickness for various embodiments of the invention;

DETAILED DESCRIPTION

Figure 1A:
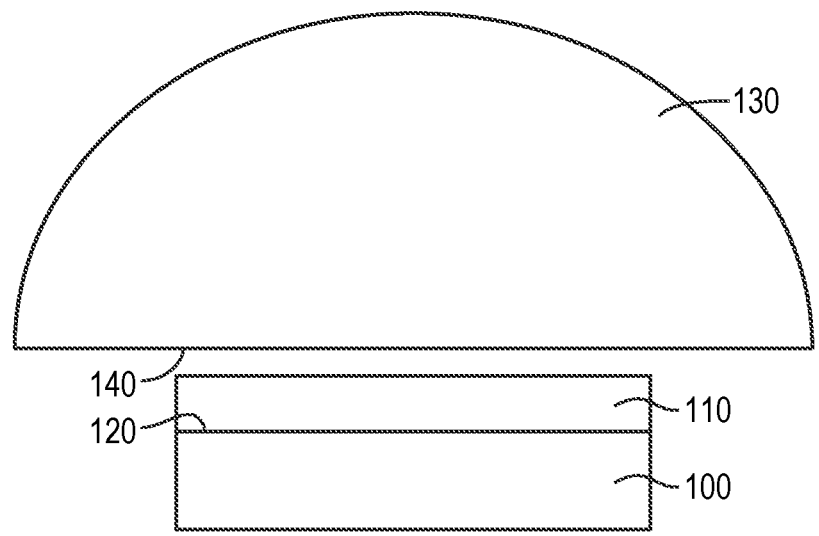
FIGS. 1A and 1B depict in cross-section the attachment of a rigid lens to a light-emitting die in accordance with various embodiments of the invention.

Embodiments of the invention include approaches to increase the photon-extraction efficiency of light-emitting devices such as UV LEDs by minimizing the total internal reflection of light transmitted from substrate into the surrounding ambient. The technique uses a thin layer (e.g., approximately 10 µm, or even thinner) of an encapsulant (e.g., an epoxy) that is transparent to short-wavelength UV radiation. FIG. 1A depicts a semiconductor die 100 having an encapsulant 110 disposed on a surface 120 thereof, as well as a lens 130 that will be attached to die 100 via the encapsulant 110. In some embodiments, the encapsulant 110 is applied to surface 140 of the lens 130 instead of or in addition to surface 120 of the die 100 prior to attachment of die 100 to lens 130.

The semiconductor die 100 may include or consist essentially of a light-emitting device such as an LED or a laser. In various embodiments, die 100 emits UV light, e.g., UVC light. The light-emitting die 100 may include an AlN substrate and, thereover, one or more quantum wells and/or strained layers including or consisting essentially of AlN, GaN, InN, or any binary or tertiary alloy thereof, within an "active," light-emitting region of the die 100. In various embodiments, die 100 includes a substrate and/or device structure resembling those detailed in U.S. Pat. No. 7,638,346, filed on Aug. 14, 2006, U.S. Pat. No. 8,080,833, filed on Apr. 21, 2010, and/or U.S. Patent Application Publication No. 2014/0264263, filed on Mar. 13, 2014, the entire disclosure of each of which is incorporated by reference herein.

The encapsulant 110 may be organic and/or polymeric. In various embodiments of the invention, the encapsulant 110 is silicone-based, and may include, consist essentially of, or consist of, for example, a silicone oil and/or a silicone resin. Prior to attachment of the lens 130, the surface 120 of the die 100 may be treated, e.g., roughened, textured, and/or patterned, in order to maximize the light extraction therefrom (i.e., by increasing the critical angle for escape of the light), as described in U.S. Ser. No. 12/764,584, filed on Apr. 21, 2010, the entire disclosure of which is incorporated by reference herein.

Figure 1B:
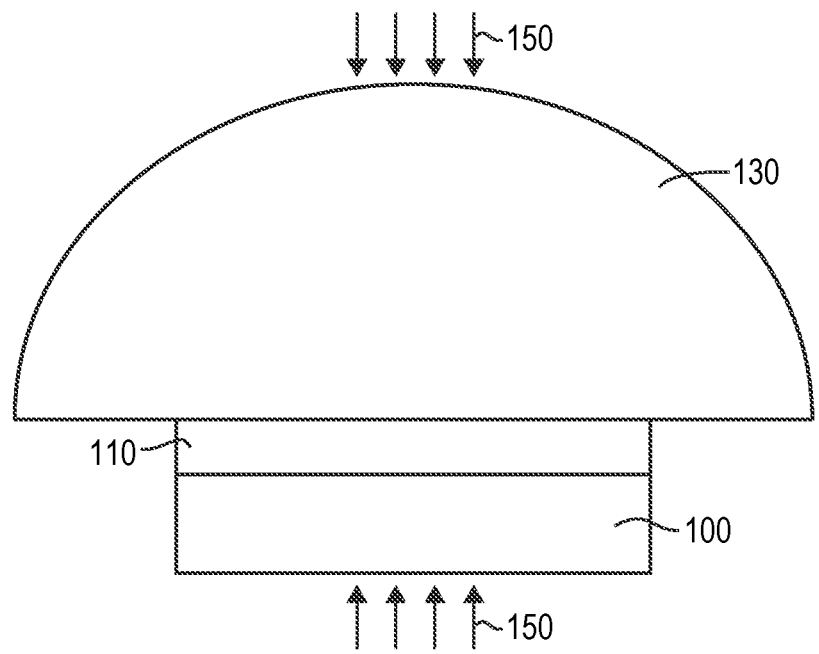
Figure 1C:
FIG. 1C is a cross-sectional schematic of a light-emitting device incorporating a rigid lens in the form of a flat plate.
Figure 1D:
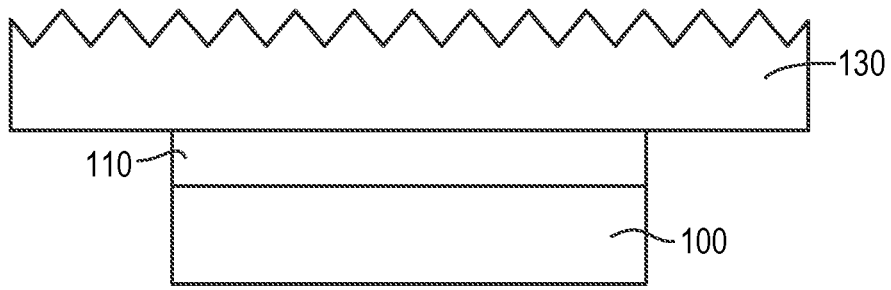
FIG. 1D is a cross-sectional schematic of a light-emitting device incorporating a rigid lens in the form of a textured flat plate.

As shown in FIG. 1B, the lens 130 is attached to die 100 via the encapsulant 110 (which may also have adhesive properties). The lens 130 is typically rigid and, in various embodiments, is at least partially hemispherical in shape. Lens 130 may be substantially hemispherical, as shown in FIGS. 1A and 1B, or may be composed of a substantially hemispherical portion and a substantially cylindrical portion (as described below). In some embodiments the lens 130 includes, consists essentially of, or consists of a substantially flat plate, as shown in FIG. 1C, or a flat plate having a surface that has been patterned or textured to improve light extraction therefrom, as shown in FIG. 1D. The lens 130 is typically inorganic, and may include, consist essentially of, or consist of, for example, fused silica, quartz, and/or sapphire. In some embodiments, the encapsulant 110 is heated (e.g., to approximately 60° C.) to provide enough fluidity to substantially gaplessly form an interface between lens 130 and die 100. Typically, the encapsulant 110 is heated at a temperature at which it still has sufficient viscosity to enable proper positioning of the lens 130 on the die 100, even after contact therebetween. (Liquid encapsulants such as silicone oil may be applied at room temperature, at least in some embodiments.) In some embodiments, force (represented by arrows 150 in FIG. 1B) is applied to the die 100 and/or the lens 130 in order to minimize the space therebetween, and thus also minimize the thickness of the encapsulant 110 therein. Even in embodiments in which the encapsulant 110 degrades (due to, e.g., exposure to UV light from die 100), the thin thickness of the layer may prevent catastrophic degradation of the performance of the device. After the lens 130 is positioned on die 100, the entire structure may be raised to an even higher temperature (e.g., up to approximately 150° C. to approximately 170° C. for 0.5 hour to 2 hours) to cure the encapsulant 110 and solidify the attachment of the lens 130 to the die 100.

The encapsulant 110 may be, in some embodiments, at least partially cured before the lens 130 is positioned on the die 100. For example, the encapsulant (e.g., dispensed on the lens 130 and/or the die 100) may be heated to, for example, up to approximately 150° C. to approximately 170° C. for 0.5 hour to 1 hour.

Various embodiments of the present invention utilize thin layers of the encapsulant material in order to ameliorate the effects of the deterioration of such layers, at least during initial periods of exposure to UV light. For example, particularly for high-power LEDs, various embodiments of the invention utilize layers of encapsulant having thicknesses less than approximately 10 µm, as detailed in U.S. patent application Ser. No. 13/533,093, filed on Jul. 19, 2012, the entire disclosure of which is incorporated by reference herein.

In various embodiments, the device (including, e.g., the die 100, encapsulant 110, and lens 130) may be subjected to a vacuum before, during, and/or after the curing of the encapsulant 110 in order to promote removal of any air and/or bubbles trapped in and/or proximate the encapsulant 110. For example, the device may be placed within a vacuum oven under, e.g., 10 Torr of vacuum. The vacuum may be applied at room temperature (e.g., approximately 25° C.) or, if the encapsulant 110 is being at least partially cured simultaneously, the vacuum may be applied at the curing temperature (e.g., as described above) or at an intermediate temperature between room temperature and the curing temperature. The vacuum may be applied for a time period of, for example, approximately 5 minutes to approximately 20 minutes, or the vacuum may be applied for the curing time (e.g., as described above) or for an intermediate time between approximately 5 minutes and the curing time.

In various embodiments, the lifetime of the overall device (i.e., the semiconductor die with the rigid lens attached) is improved by making the encapsulant layer as thin as possible. Such thickness minimization may be achieved by applying force to the lens and/or the die during the curing process. The minimization of encapsulant thickness typically renders the encapsulant thickness insufficient for the encapsulant to function as a thermal expansion mismatch buffer (in which case one would typically increase the encapsulant thickness to prevent strain propagation therethrough and improve reliability of the device). FIGS. 2A, 2B, 3A, and 3B depict the impact of temperature change (resulting from, e.g., the elevated temperature of the die during light emission) on the strain profile within the assembled device in accordance with various embodiments of the present invention.

Figure 2A:
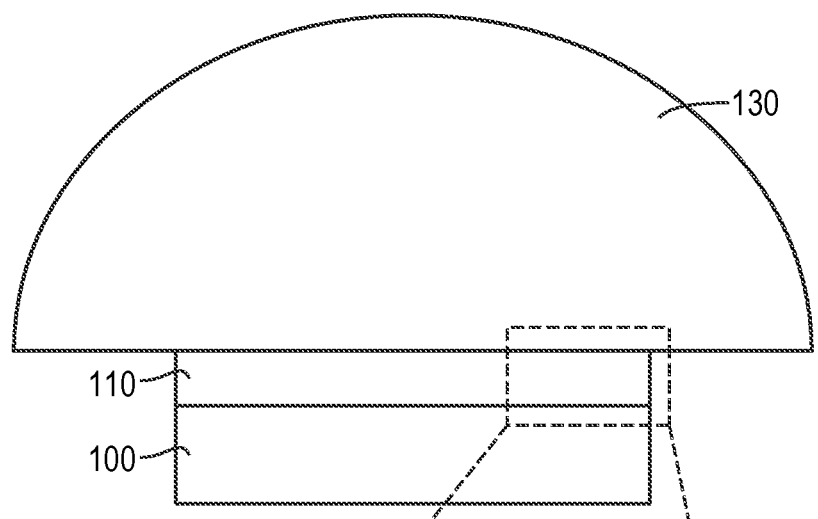
FIG. 2A is a schematic cross-section of, at room temperature, an illumination device incorporating a light-emitting die, an encapsulant, and a rigid lens in accordance with various embodiments of the invention.
Figure 2B:
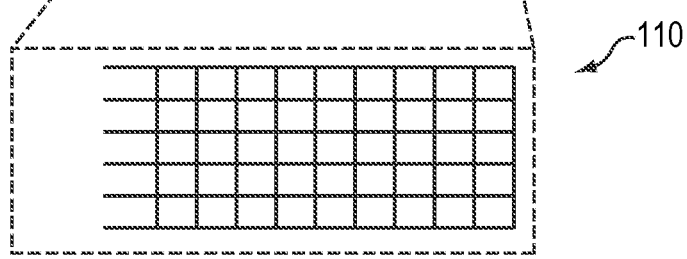
FIG. 2B is a magnified representation of the stress state within the encapsulant of FIG. 2A.

FIGS. 2A and 2B depict an assembled device and the strain state of the encapsulant 110 at approximately room temperature (e.g., after assembly but while die 100 is not operating). As shown, since the device is at approximately the temperature at which it was assembled, there is approximately no thermal-mismatch strain resulting from and/or propagating between the die 100 and the lens 130, despite the fact that their expansions of thermal expansion are different. FIG. 2B indicates that, in this situation, there is substantially no shear stress within the encapsulant 110 indicative of such thermal-mismatch strain.

Figure 3A:
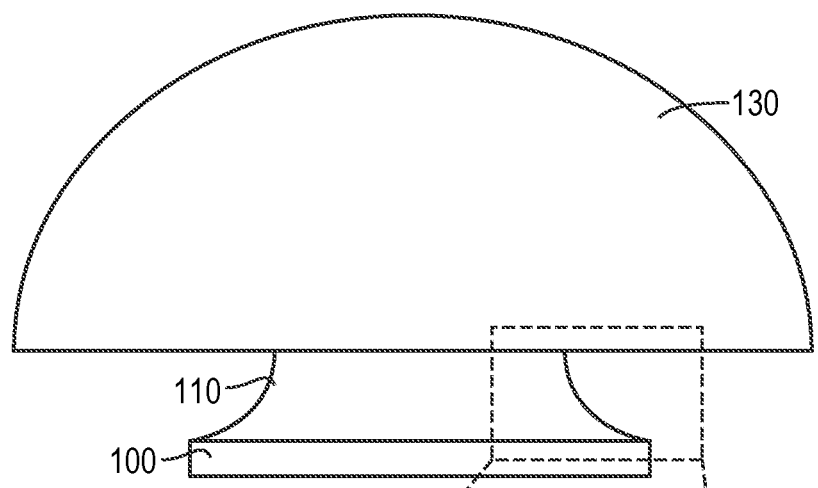
FIG. 3A is a schematic cross-section of, at elevated temperature, an illumination device incorporating a light-emitting die, an encapsulant, and a rigid lens in accordance with various embodiments of the invention.
Figure 3B:
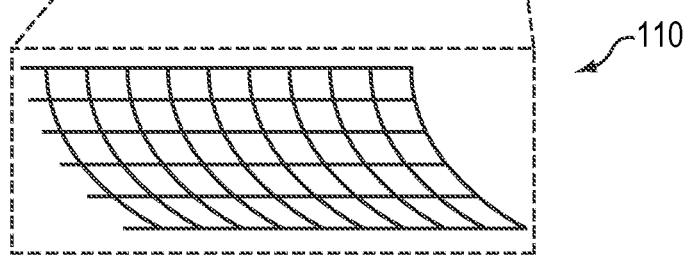
FIG. 3B is a magnified representation of the stress state within the encapsulant of FIG. 3A.

In contrast, FIGS. 3A and 3B depict the assembled device and the strain state of the encapsulant 110 at elevated temperature (e.g., during operation of die 100). As shown, the difference in thermal-expansion coefficients of the lens 130 and the die 100 results in thermal-mismatch strain propagating therebetween, as indicated by the shear stress and deformation through the entirety of the layer of encapsulant 110. Specifically, in this case the thickness of the encapsulant 110 is insufficient to accommodate the thermal mismatch-induced strain and prevent its propagation between die 100 and lens 130. (In the contrary case where the thickness of the encapsulant is sufficiently thick, at least a portion of the encapsulant layer would greatly resemble the encapsulant 110 shown in FIG. 2B, as the shear stress within the layer would be proportionally smaller.) The linear thermal expansion coefficient of die 100 may be larger than that of the lens 130, for example, larger by approximately a factor of 10 or more. In one embodiment, die 100 (or at least a substrate portion thereof supporting one or more active, light-emitting layers) includes or consists essentially of single-crystal AlN and has a linear thermal expansion coefficient of approximately $5\times10^{-6}$/K, while lens 130 includes, consists essentially of, or consists of silica and has a linear thermal expansion coefficient of approximately $0.6\times10^{-6}$/K. Despite the amount of shear stress through the entire thickness of the encapsulant 110, and thus the amount of thermal expansion mismatch-induced strain propagating between lens 130 and die 100, the optical performance of the assembled device is surprisingly superior due to the minimized thickness of the encapsulant 110, which limits the decrease in optical transmission due to light-induced deterioration of encapsulant 110.

Figure 4A:
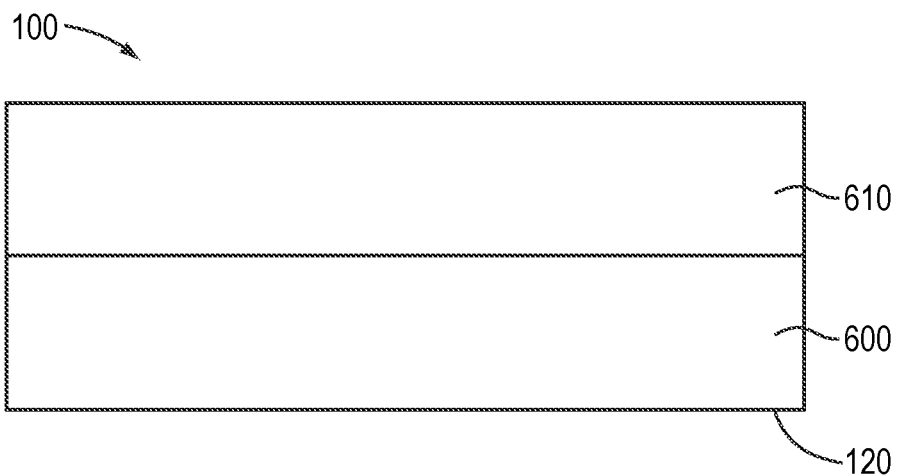
FIG. 4A is a schematic cross-section of a light-emitting die utilized in embodiments of the invention.

The impact of the thermal-mismatch strain may be decreased via reduction of the thickness of die 100 by, e.g., removal of at least a portion of the substrate, on which the light-emitting layers are formed, thereof. Such thinning may be performed in addition to, or in conjunction with, the surface patterning described above with reference to FIGS. 1A and 1B, as described in U.S. Pat. No. 8,080,833, filed Apr. 21, 2010, the entire disclosure of which is incorporated by reference herein. FIG. 4A schematically depicts a semiconductor die 100 that incorporates a substrate 600 and, thereover, a layered region 610 that includes or consists essentially of one or more epitaxially deposited semiconductor layers including the active (i.e., light-emitting) region of die 100. The substrate 600 is typically a semiconductor material, e.g., silicon, GaN, GaAs, InP, or AlN, but in various embodiments includes, consists essentially of, or consists of single-crystal AlN. In embodiments in which die 100 is a light-emitting device, layered region 610 typically includes one or more of buffer layers, cap layers, contact layers, quantum wells, multiple quantum well (MQW) regions (i.e., multiple quantum wells separated by thin barrier layers), as known to those of skill in the art.

Figure 4B:
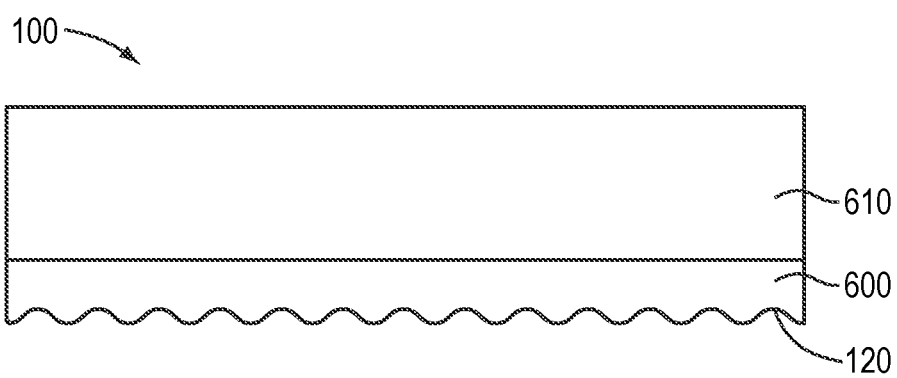
FIG. 4B depicts the light-emitting die of FIG. 4A after substrate thickness reduction and texturing performed in accordance with embodiments of the invention.

In order to mitigate the impact of thermal-mismatch strain on die 100 and enhance light transmission from die 100, at least a portion of substrate 600 may be removed and/or textured, as shown in FIG. 4B. If, for example, substrate 600 has a total thickness variation higher than about 20 μm, then the back surface 120 may be ground, for example, with a 600 to 1800 grit wheel. The removal rate of this step may be purposefully maintained at a low level (approximately 0.3-0.4 μm/s) in order to avoid damaging the substrate 600 or the layered region 610. After the optional grinding step, the back surface 120 may be polished with a polishing slurry, e.g., a solution of equal parts of distilled water and a commercial colloidal suspension of silica in a buffered solution of KOH and water. The removal rate of this step may vary between approximately 10 μm/min and approximately 15 μm/min. Substrate 600 may be thinned down to a thickness of approximately 200 μm to approximately 250 μm, or even to a thickness of approximately 20 μm to approximately 50 μm, although the scope of the invention is not limited by this range. In other embodiments, the substrate 600 is thinned to approximately 20 μm or less, or even substantially completely removed. The thinning step may be followed by wafer cleaning in, e.g., one or more organic solvents. In one embodiment of the invention, the cleaning step includes immersion of substrate 600 in boiling acetone for approximately 10 minutes, followed by immersion in boiling methanol for approximately 10 minutes.

Once substrate 600 is cleaned, the surface 120 thereof may be patterned, i.e., textured, by etching in a suitable solution (e.g., a basic solution such as KOH in deionized (DI) water). In another embodiment of the invention, the etching agent is a solution of NaOH in DI water. The molarity of the basic solution may vary between approximately 1M and approximately 20M, and the etching time may vary between approximately 1 minute and approximately 60 minutes. The temperature of the etching solution may vary between approximately room temperature up to approximately 100° C. Similar results may be obtained when using a higher molarity solution for shorter periods of time and vice versa. In one embodiment of the invention, substrate 600 is etched in a 4M solution of KOH and DI water for 8 minutes while maintaining the solution at approximately 20° C.

The rigid lens 130 may be formed in the desired shape and size from a larger piece of the desired material or may be directly "molded" into the desired shape and size. For example, in accordance with various embodiments of the invention, a sol-gel process is utilized to form the lens 130. For example, in order to produce a fused-silica lens, a precursor chemical solution containing nano-scaled silica particles may be inserted into a mold where it thickens into a gel. The thickened part is then removed from the mold and dried, resulting in an open-pore material having pores that may be filled with a gas. The dried part is then sintered at temperatures of, for example, greater than 1000° C., during which the part shrinks to the desired dimensions and densifies into a material nearly identical to fused silica and with high transparency in the deep UV. The lens 130 may contain trace amounts of carbon or other elements from, e.g., the precursor solution. Designations for lenses herein such as "fused silica" and the like also encompass such materials formed by solution processing (such as sol-gel processes), even if such materials also contain trace elements such as carbon (although in various embodiments of the present invention, lenses 130 have carbon contents less than 1 ppm). Moldable processes such as sol-gel processes enable the tuning of exact dimensions and shape with high reproducibility and low cost when producing rigid lenses such as the fused-silica lenses described above.

Figure 5:
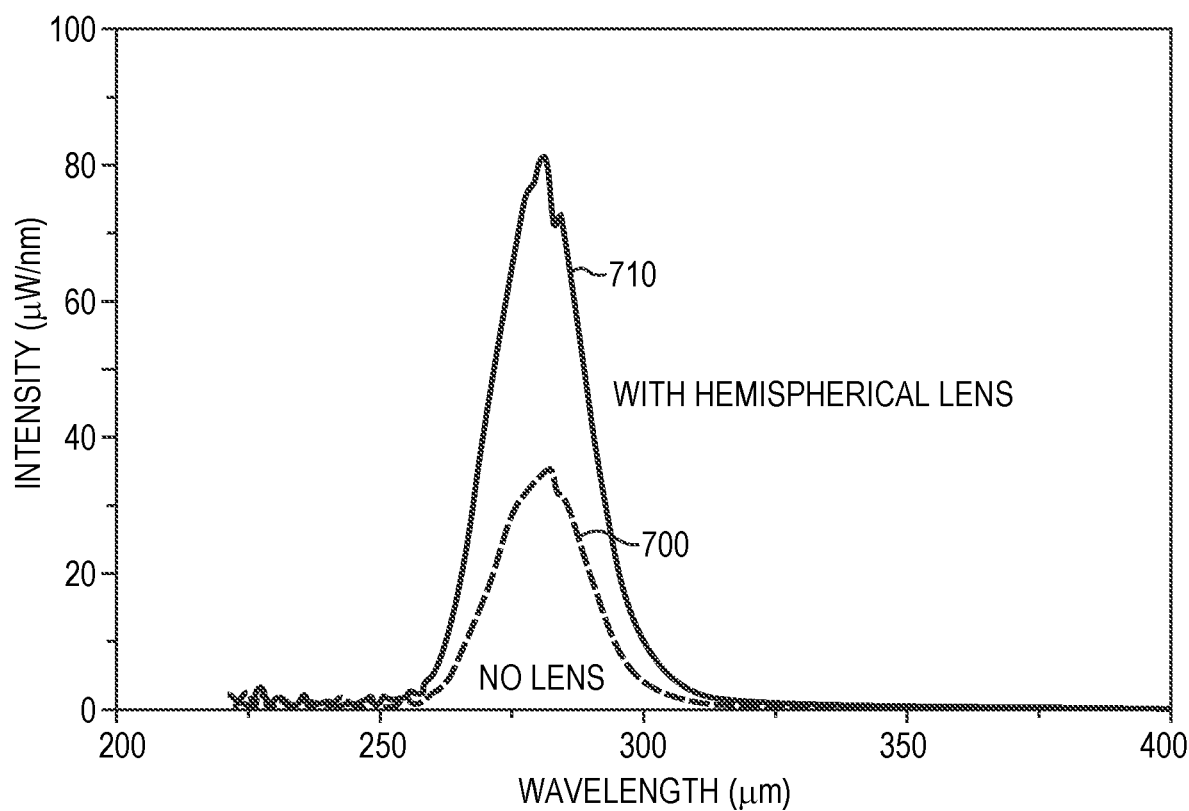
FIG. 5 depicts plots of the light intensity emitted from a UV LED with and without a rigid lens applied thereto in accordance with embodiments of the invention.

Due to the larger refractive index of the encapsulant 110 (e.g., around 1.4 at 260 nm) compared to the air, the critical angle calculated from Snell's law for total internal reflection from the substrate 600 (e.g., AlN) into the encapsulant 110 is increased, which in turn increases the photon-extraction efficiency of the device. The lens 130 then extracts substantially all of the light from the encapsulant 110, as the lens 130 may have a similar refractive index (e.g., around 1.5 at 260 nm). The lens 130 is also typically larger in size than the die 100 (e.g., along a lateral dimension such as a width or diameter) in order to extract as much light as possible from the die 100. In an embodiment, the die 100 is approximately 0.8 mm on a side, and the lens 130 is hemispherical with a diameter of approximately 2 mm. As shown in FIG. 5, the output power of an exemplary UV LED is increased by approximately 2.6× with the addition of a hemispherical fused silica lens 130 attached to the die 100 with a thin layer of an encapsulant 110. FIG. 5 includes plots, as functions of wavelength, of the intensity 700 of light emitted without the lens 130 and the intensity 710 of light emitted with the lens 130.

Figure 6:
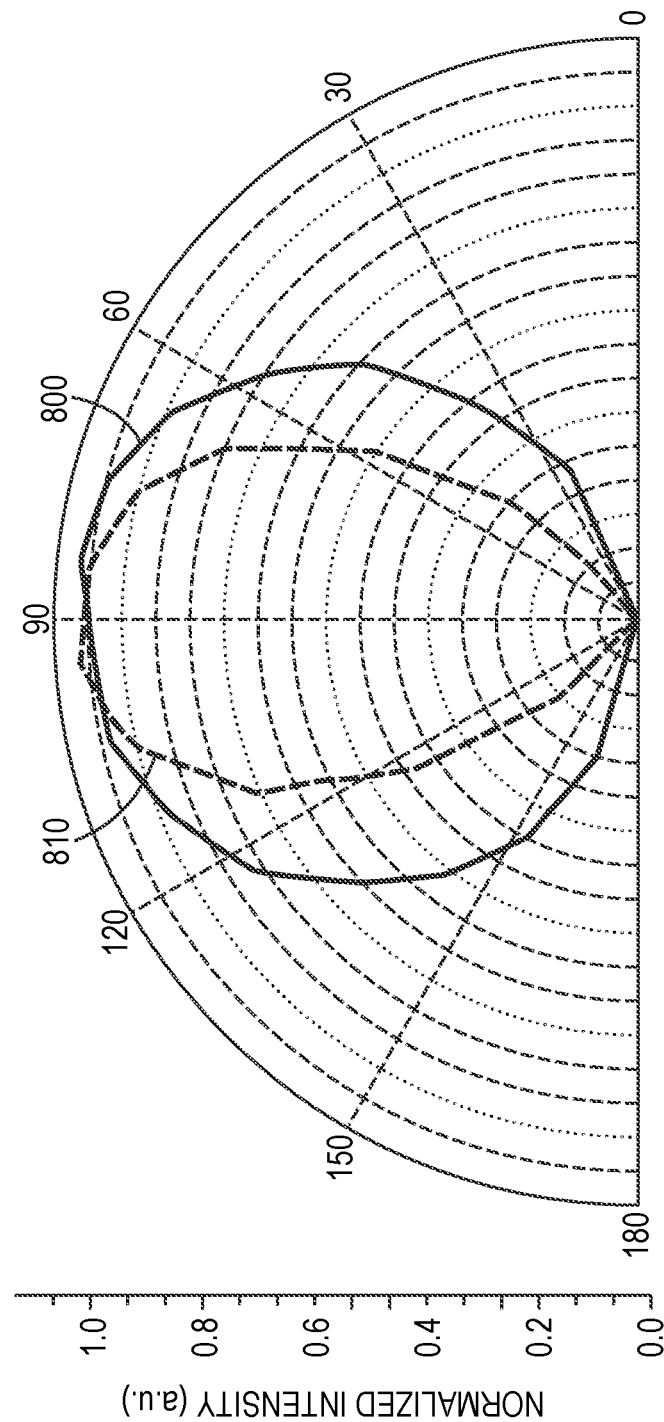
FIG. 6 depicts plots of far filed patterns of light-emitting dies with and without a rigid lens applied thereto in accordance with embodiments of the invention.

The radiation pattern of a light-emitting semiconductor die 100, e.g., an LED, may also be improved via selection of the inorganic lens material and shape of its surface. FIG. 6 depicts the full width, half-maximum (FWHM) of the radiation pattern from an LED both with and without a sapphire lens attached to the LED die 100 with a thin layer of encapsulant 110. As shown, the far field pattern 800 of the LED die 100 without lens 130 has a FWHM of approximately 120°, while with the sapphire lens 130, the far field pattern 810 has a FWHM of approximately 72°. The far field pattern may be reduced even further via use of a cylindrical-hemispherical lens, as detailed below.

Figure 7:
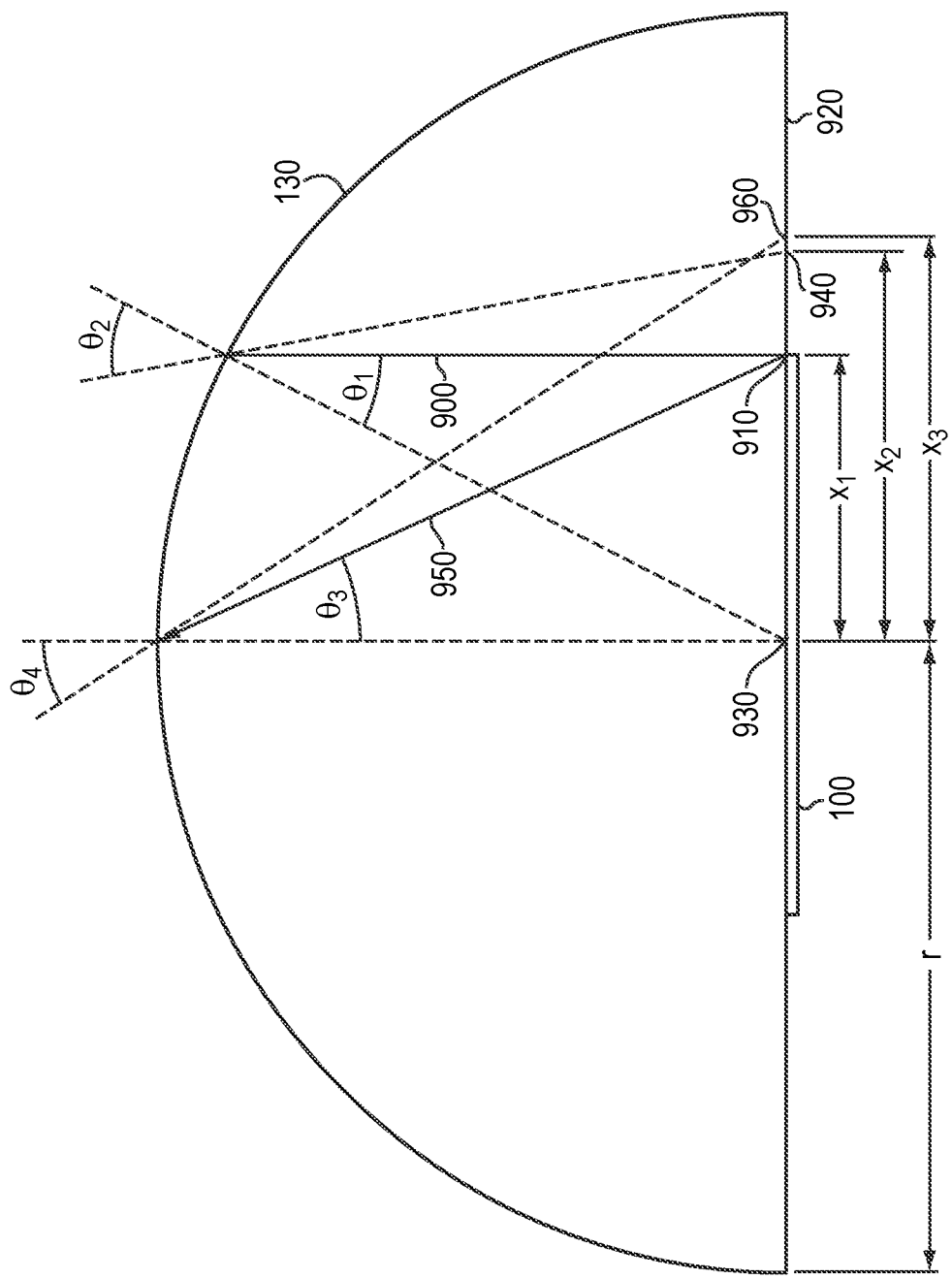
FIG. 7 is a schematic depiction of the effect of lens size on the distortion of light from a light-emitting die attached thereto in accordance with embodiments of the invention.

Typically, the radiation pattern emitted by an LED after attachment of a hemispherical lens will remain Lambertian (as shown in FIG. 6) after attachment of the lens if the encapsulant is kept very thin. However, the size of the emitting surface will generally be magnified by the addition of the lens. The amount of this magnification will be equal to the index of refraction of the lens and the distortion of the LED will be reduced by making the lens diameter larger relative to the size of the LED. That is (and as shown in FIG. 7), $$\frac{X_2}{X_1} = \frac{\frac{r*\sin\theta_2}{\cos(\theta_2 - \theta_1)}}{r*\sin\theta_1} = \frac{n}{\cos(\theta_2 - \theta_1)} \quad (1)$$

$$\sin\theta_2 = n*\sin\theta_1 \quad (2)$$

$$\frac{X_3}{X_1} = \frac{\frac{r}{\tan\theta_4}}{\frac{r}{\tan\theta_3}} = \frac{\frac{n}{\cos\theta_4}}{\cos\theta_3} \quad (3)$$

$$\sin\theta_4 = n*\sin\theta_3 \quad (4)$$

where a ray 900 is a light ray emitted from a point 920 on the LED 100 in the direction perpendicular to the flat surface 920 of hemispherical lens 130; $X_1$ is the distance between point 920 and center point 930 of the LED 100; $X_2$ is the distance between the point 940, where the reverse extending line of ray 900's emergent ray intersects with the flat surface 920, and center point 930; r is the radius of hemispherical lens 130; $\theta_1$ is the incident angle of ray 900; $\theta_2$ is the transmission angle of ray 900; n is the refractive index of the hemispherical lens 130; ray 950 is a light ray emitted from point 910 through the point directly above center point 930; $X_3$ is the distance between the point 960, where the reverse extending line of ray 950's emergent ray intersects with the flat surface of hemispherical lens 130, and center point 930; $\theta_3$ is the incident angle of ray 950; and $\theta_4$ is the transmission angle of ray 950.

As indicated by equations (1) and (3) above, when $X_1$ is much smaller than r, $X_2/X_1$ and $X_3/X_1$ both converge to n and the two reserve extended lines intersect almost at the same point on the flat surface of lens 130. For dies 100 with an edge length (or diameter, for circular dies) comparable to twice the radius r (i.e., the diameter) of the lens 130, the image of (and thus the light emitted from) die 100 is distorted. Thus, in various embodiments of the invention, the diameter of lens 130 is significantly larger (e.g., at least two times larger, five times larger, or even ten times larger or more) than an edge length or diameter of die 100 to minimize distortion of light from die 100.

Figure 8:
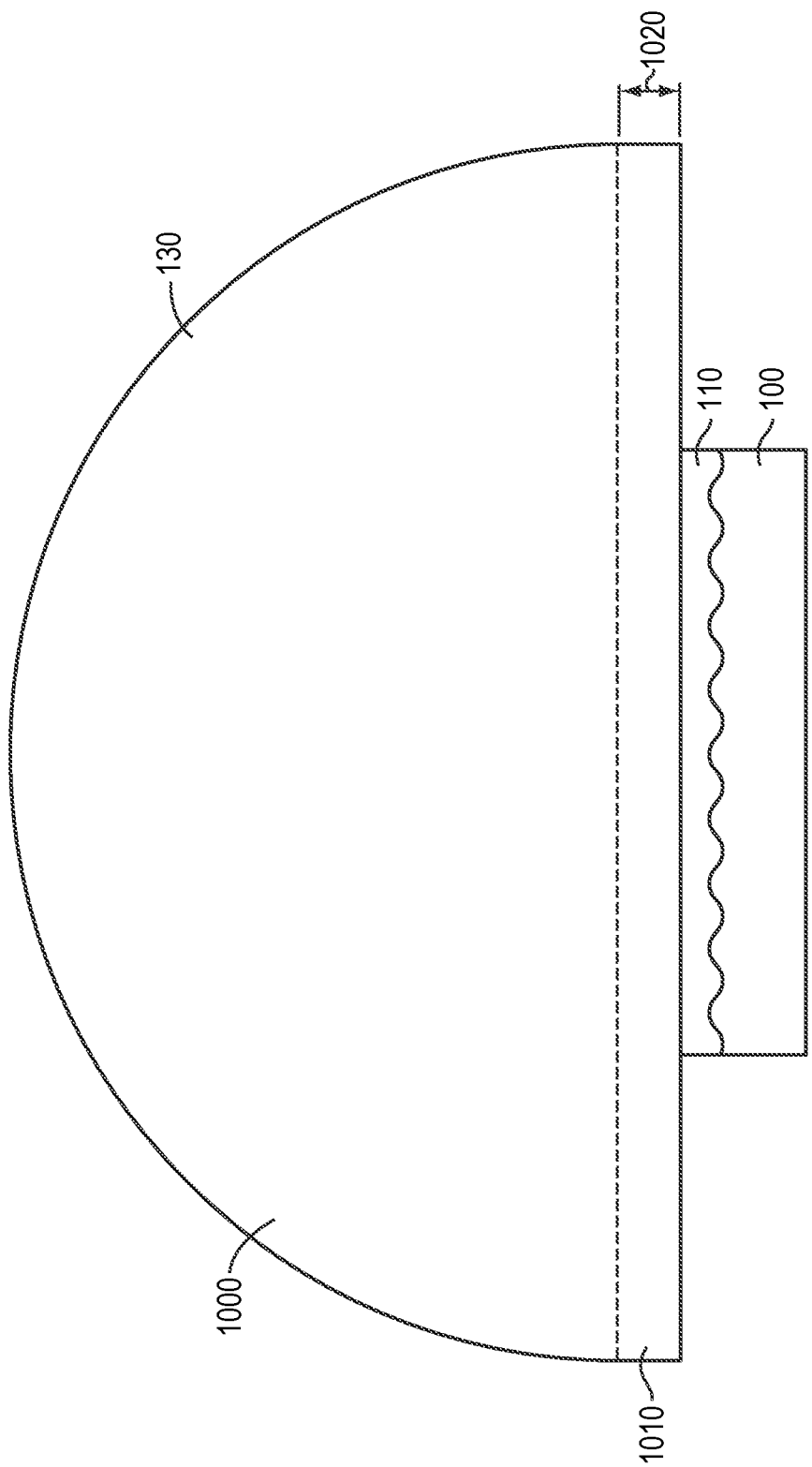
FIG. 8 is a schematic cross-section of a lens having hemispherical and cylindrical portions attached to a light-emitting die in accordance with various embodiments of the invention.

The far field divergence of the die 100 (e.g., an LED) is improved with little or no impact on photon extraction efficiency in accordance with various embodiments of the present invention via the use of a lens 130 having a shape with a cylindrical component as well as a hemispherical component, as shown in FIGS. 8 and 9. FIG. 8 depicts an LED die 100 (e.g., a mid-UV LED) having a roughened (i.e., textured) surface 120 and attached to such a lens 130 via a thin layer of encapsulant 110 (e.g., a silicone-based encapsulant). As shown, the lens 130 has a hemispherical portion 1000 and a cylindrical portion 1010 (e.g., having a constant diameter equal to that of the largest diameter of hemispherical portion 1000) having a thickness, or "cylinder height" 1020. Simulations were performed to determine the photon extraction efficiency and far field divergence of various different embodiments. The results are compared to a baseline value of photon extraction efficiency for a bare (but roughened) LED without the lens 130 or encapsulant 110, shown as Case 1 in FIG. 9. Cases 2 and 3 represent embodiments in which the lens 130 is purely hemispherical (i.e., no cylindrical component), demonstrating the above-described increase in photon extraction efficiency and modest improvement in the far field divergence. As FIG. 9 illustrates, increasing the thickness of the cylindrical component of the lens enables the decrease of far field divergence to at least 40° FWHM with little or no deleterious effect on the photon extraction efficiency, and to even lower levels (i.e., to at least 25°) with only modest impact on the photon extraction efficiency (which remains much improved over that of the Case 1 baseline value). This nearly collimated beam of UV light is very desirable for certain applications that utilize a concentrated beam. As also shown in FIG. 9, increases in the lens diameter also tend to improve photon extraction efficiency and to decrease the far field divergence, as also discussed above.

In addition to improving the light extraction efficiency of a single semiconductor die, embodiments of the invention exhibit similar results when utilizing an array of two or more semiconductor dies (e.g., LED dies). For example, a 4×4 array of dies may be used with a rigid lens having a diameter that is significantly larger (e.g., at least two times larger, five times larger, or even ten times larger or more) than an edge length or diameter of the array to minimize distortion of light. Modeling was performed for arrays of different sizes (i.e., different numbers of dies) and showed that a relatively larger diameter of the lens compared to the edge length or diameter of a full array may be necessary to achieve similar improvement of the photon extraction efficiency compared to embodiments incorporating a single small semiconductor die. The modeling results are shown in the table below.

| Size of LED array | Edge Lengths of the Array | Lens Material | Lens Diameter | Photon Extraction Efficiency | Far Field FWHM |
|---|---|---|---|---|---|
| 1 × 1 | 0.8 × 0.8 mm | N/A | N/A | 1.0× | 120° |
| 1 × 1 | 0.8 × 0.8 mm | Fused Silica | 2 mm | 2.2× | 114° |
| 3 × 3 | 3.8 × 3.4 mm | Fused Silica | 6 mm | 1.9× | 140° |
| 3 × 3 | 3.8 × 3.4 mm | Fused Silica | 8 mm | 2.2× | 134° |
| 4 × 4 | 5.3 × 4.7 mm | Fused Silica | 8 mm | 1.9× | 144° |
| 4 × 4 | 5.3 × 4.7 mm | Fused Silica | 10 mm | 2.2× | 140° |
| 5 × 5 | 6.8 × 6.0 mm | Fused Silica | 10 mm | 1.9× | 144° |
| 5 × 5 | 6.8 × 6.0 mm | Fused Silica | 14 mm | 2.2× | 134° |

In addition, a 3×3 array of light-emitting semiconductor dies was integrated with a 6 mm diameter rigid lens and exhibited an improvement of light extraction efficiency of 1.4×, even though the lens was not large enough to fully optimize the photon extraction efficiency. Therefore, embodiments of the invention incorporating even larger lenses will exhibit improvements in photon extraction efficiency of 2× or even more.

Various embodiments of the invention incorporate an organic encapsulant that degrades upon exposure to UV light, such as a silicone oil or silicone resin. In particular, such organic encapsulants may experience partial oxidation when exposed to UV light (e.g., during an initial period of light emission by the device), altering the refractive index of the encapsulant and/or forming small localized areas from which light from the light-emitting die scatters, decreasing the amount of UV light reaching the lens and ultimately being emitted therefrom. In accordance with various embodiments of the invention, such encapsulants are surprisingly and advantageously at least partially converted to non-stoichiometric silica material via additional exposure to UV light during a burn-in period before final packaging, shipment to a customer, and/or incorporation of the UV device into a larger system or device advantageously utilizing the emitted UV light (e.g., a disinfection, purification, and/or biocidal system for liquids and/or gases, medical devices, imaging systems, curing systems, printing systems, optical sensors, etc.). Specifically, the carbon content of the encapsulant diminishes to, for example, less than 40 atomic %, less than 30 atomic %, or even less than 20 atomic % as the encapsulant is at least partially converted into the non-stoichiometric silica material, and the transmissivity of the encapsulant improves considerably and is robust for at least thousands of hours of operation of the device. In various embodiments, after exposure to UV light, the encapsulant is converted into a non-stoichiometric silica material consisting essentially of, or even consisting of, carbon, oxygen, and silicon, where the carbon content is greater than 1 ppm (and in some cases greater than 1 atomic %) and less than 30 atomic %, or even less than 20 atomic %. In such embodiments, the preference for a small encapsulant thickness detailed above may be relaxed, and the encapsulant may have a thickness greater than 10 μm (or even greater than 50 μm) and/or may even be utilized to replace the rigid lens 130.

Figure 10:
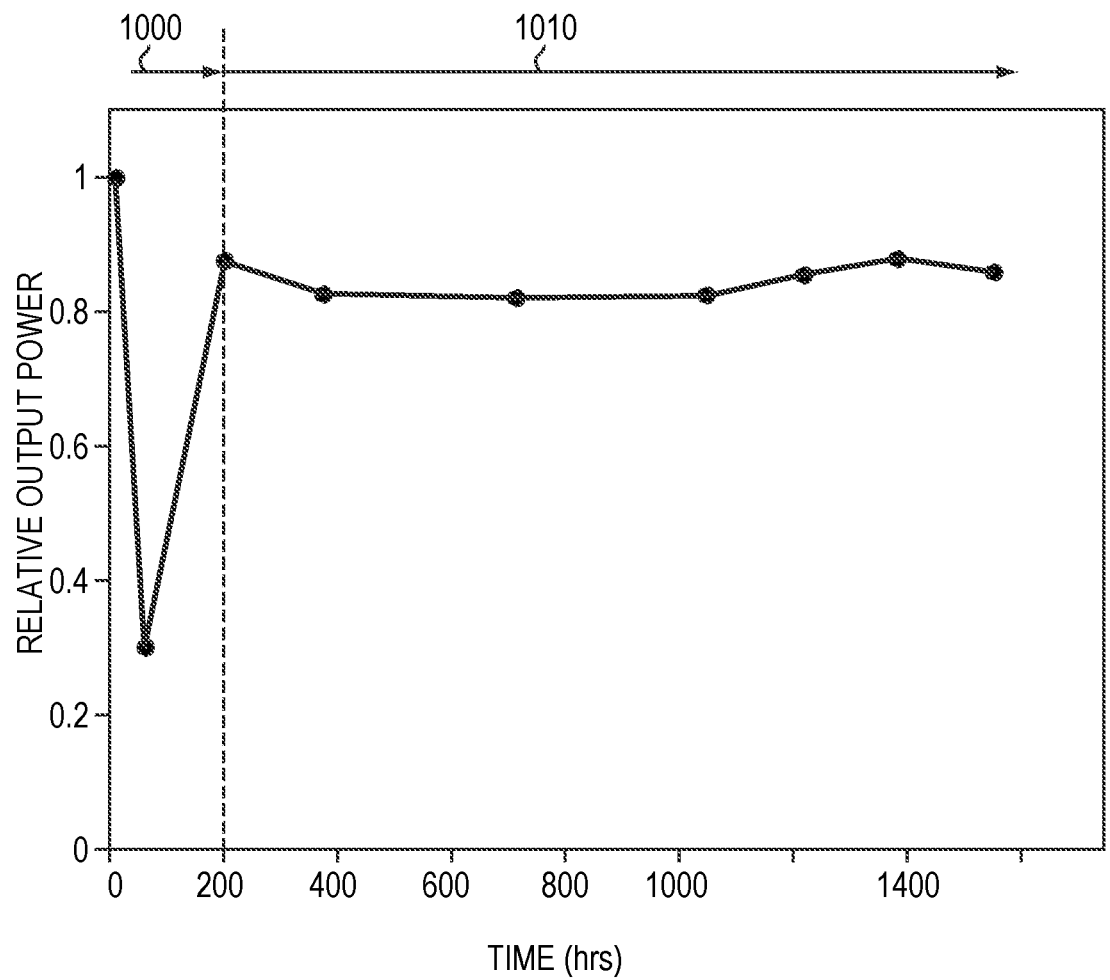
FIG. 10 is a graph of relative output power for a UV light-emitting device over time in accordance with various embodiments of the invention.

FIG. 10 is a graph of relative output power for a UV light-emitting device in accordance with embodiments of the present invention that incorporates the encapsulant conversion process described above. As shown, when the encapsulant is initially exposed to UV light from the device during a burn-in period 1000 (i.e., within the manufacturing process before final packaging and shipment to a customer), the output power drops dramatically for a period of less than 200 hours. Then, after continued exposure to the UV light, the output power gradually rises to a level nearly as high as the initial output power (e.g., to about 80%-90% of the brief initial power level) after a period of 200-400 hours, and then the output power remains substantially constant with device operation time during a customer operation period 1010 up to at least a period of 2000 hours. As shown in FIG. 10, the initial output-power drop generally corresponds to a "burn-in" process during device manufacturing and before sales of devices to customers; thus, once such devices are provided to customers they exhibit no such dramatic drop in output power with usage. The data shown in FIG. 10 is for exposure to UV light having a wavelength of approximately 263 nm, although embodiments of the present invention are not limited to this particular wavelength and may utilize any wavelength of UV light (e.g., UVC light).

Figure 11A:
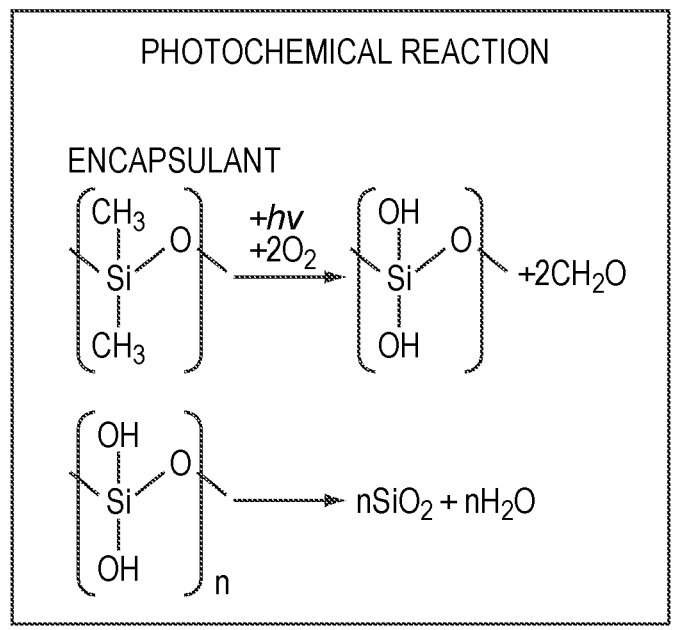
FIG. 11A depicts an exemplary photochemical reaction occurring in organic encapsulant materials in accordance with various embodiments of the invention.
Figures 11B, 11C:
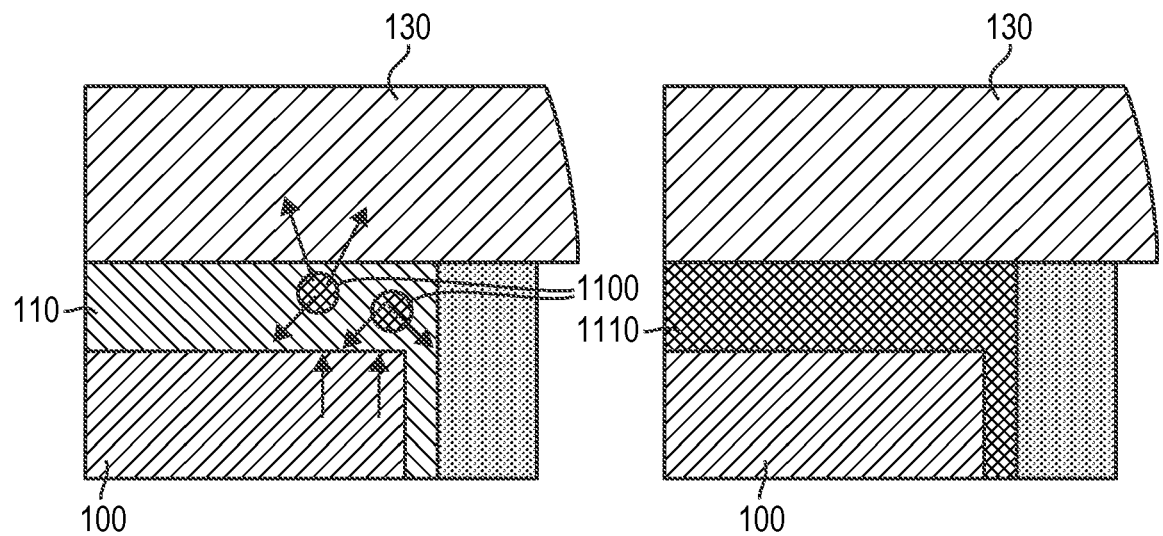
FIG. 11B is a schematic partial cross-section of a device during the photochemical reaction of FIG. 11A in accordance with various embodiments of the invention.
FIG. 11C is a schematic partial cross-section of a device after the photochemical reaction of FIG. 11A in accordance with various embodiments of the invention.

FIG. 11A illustrates a photochemical reaction that the encapsulant may be undergoing in various embodiments of the present invention. As shown, the encapsulant may be a silicone oil, i.e., a liquid polymerized siloxane with organic side chains. The encapsulant is exposed to the energetic UV photons from the light-emitting die, and the encapsulant is gradually converted into non-stoichiometric silica material (and eventually even silica) and water via intermediate conversion of carbon-containing side chains into hydroxyl side chains. As shown in FIG. 11B, during the conversion process small portions of the encapsulant 110 may thus be converted into material having a different refractive index, thereby forming scattering centers 1100 and leading to scattering events that diminish the output power of the device during the burn-in process implemented during device manufacturing. Once a substantial portion, or even all, of the encapsulant 110 is converted into non-stoichiometric silica material 1110 (or eventually even silica), as shown in FIG. 11C, the number of scattering events is reduced or substantially eliminated, and the output power recovers to high levels as shown in FIG. 10.

Figure 12:
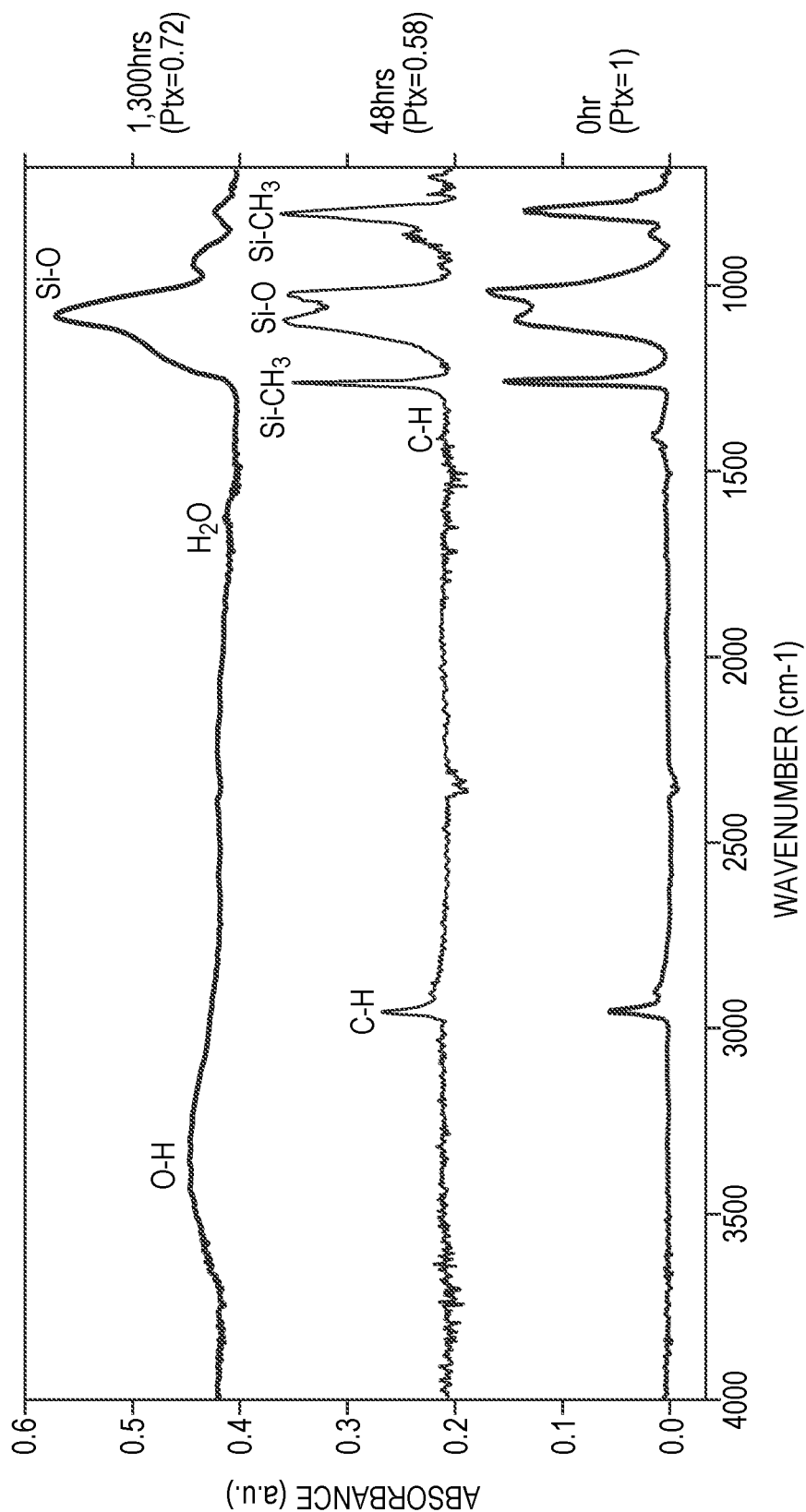
FIG. 12 is a graph of micro-infrared spectroscopy characterization results of an encapsulant before exposure to UV light (0 hours) and after exposure times of 48 hours and 1300 hours in accordance with various embodiments of the invention.

FIG. 12 shows micro-infrared spectroscopy characterization results of an encapsulant in accordance with embodiments of the present invention before exposure to UV light (0 hours) and after exposure times of 48 hours and 1300 hours. In FIG. 12, the sample exposed for 48 hours was exposed to UV light having a wavelength of 257 nm, and the sample exposed for 1300 hours was exposed to UV light having a wavelength of 263 nm; these wavelengths are not limiting, and embodiments of the invention may utilize other wavelengths of UV light. As shown, the peaks arising from the alkyl groups $Si-CH_3$ and $C-H$ largely disappear between the exposure times of 48 hours and 1300 hours, while peaks for O—H and H$_2$O appear during that time. Notably, the spectroscopy profile of the sample after 1300 hours closely approximates that of pure silica. In addition, as indicated on FIG. 12, the output power ("Ptx") of the sample exposed for 1300 recovered to about 72% of the initial power level (i.e., at 0 hours), much higher than the 58% of the initial power level exhibited by the sample exposed for 48 hours.

Figure 13D:
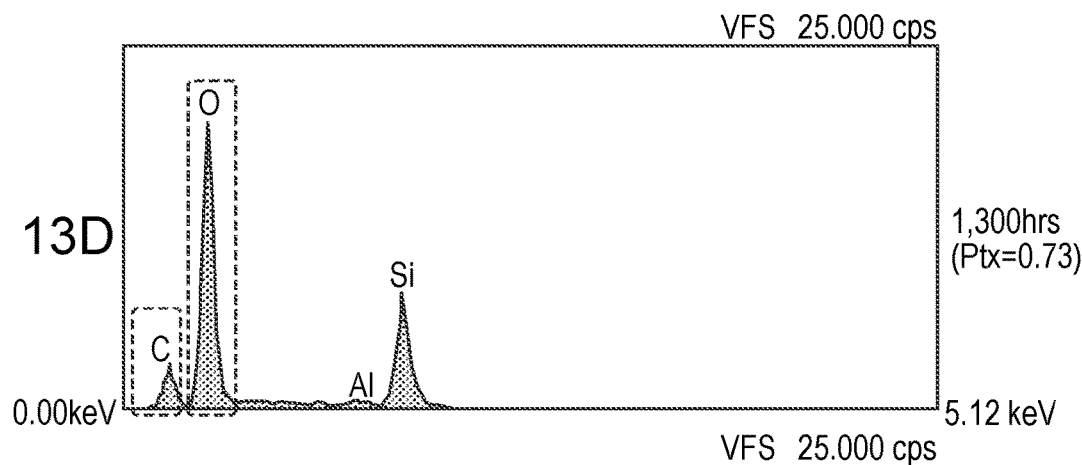
FIG. 13D is a graph of energy-dispersive X-ray (EDX) spectroscopy measurements of an encapsulant after exposure to UV light for 1300 hours in accordance with embodiments of the invention.
Figure 13C:
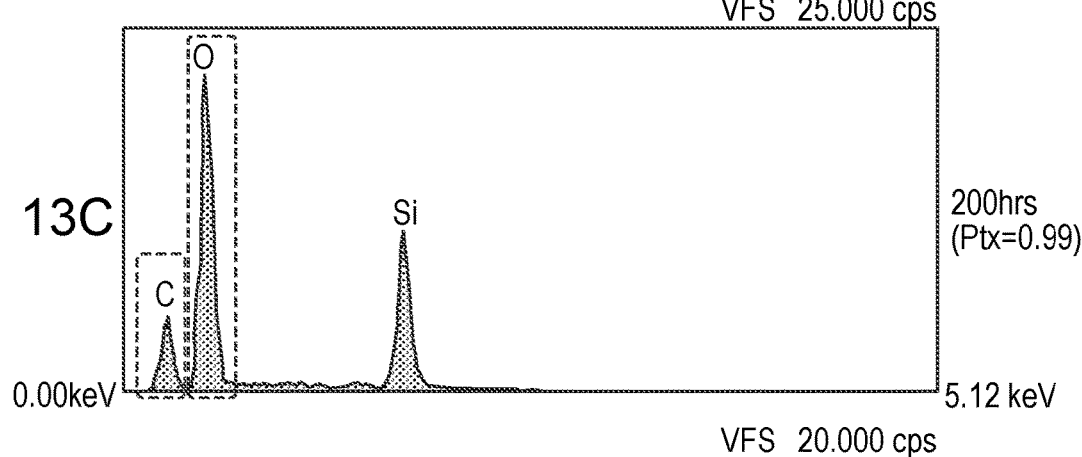
FIG. 13C is a graph of energy-dispersive X-ray (EDX) spectroscopy measurements of an encapsulant after exposure to UV light for 200 hours in accordance with embodiments of the invention.
Figure 13B:
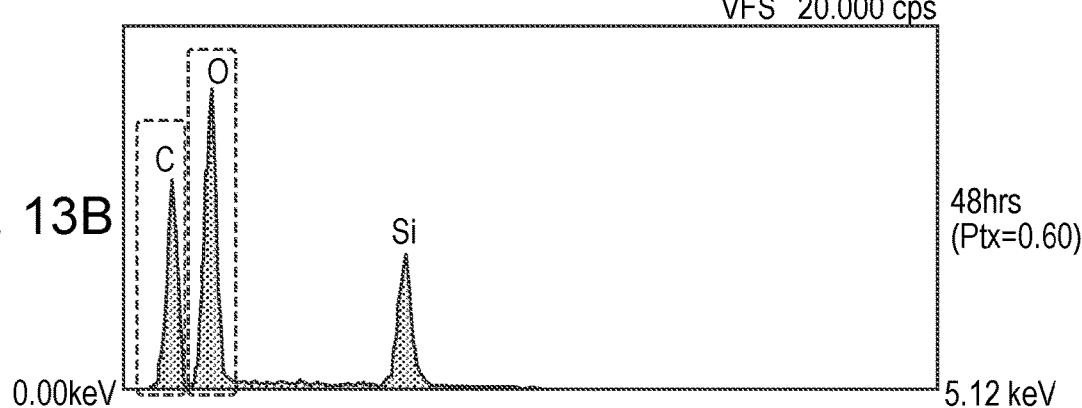
FIG. 13B is a graph of energy-dispersive X-ray (EDX) spectroscopy measurements of an encapsulant after exposure to UV light for 48 hours in accordance with embodiments of the invention.
Figure 13A:
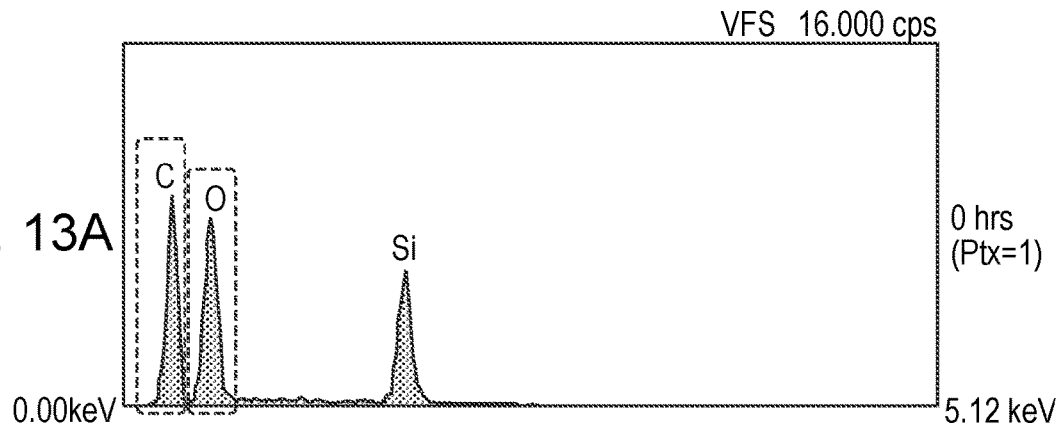
FIG. 13A is a graph of energy-dispersive X-ray (EDX) spectroscopy measurements of an encapsulant prior to exposure to UV light in accordance with embodiments of the invention.

FIGS. 13A-13D depict confirmatory results from energy-dispersive X-ray (EDX) spectroscopy measurements of an encapsulant in accordance with embodiments of the present invention at exposure times of 0 hours, 48 hours, 200 hours, and 1300 hours, respectively. As shown, the amount of carbon detected in the encapsulant decreases with increasing UV exposure time, while the amount of oxygen increases. FIG. 13A depicts the results from the unconverted encapsulant prior to any exposure to UV light and having an initial power output. As shown in FIG. 13B, after an exposure to UV light of 48 hours, the carbon content of the encapsulant has dropped, the oxygen content has increased, and the power output level is only about 60% of the initial power output due to, e.g., the above-described scattering from localized regions of the encapsulant having different refractive indices. FIG. 13C shows the EDX spectroscopy measurements at the approximate end of the burn-in period after exposure to UV light of 200 hours. As shown, the carbon content of the encapsulant has decreased dramatically as substantially all of the encapsulant has been converted into non-stoichiometric silica material, and the output power has recovered to approximately the same level as that exhibited prior to any exposure to UV light. FIG. 13D shows that, after exposure to UV light for 1300 hours, the carbon content has further decreased (with concomitant increase in oxygen content), as the non-stoichiometric silica material continues to be converted into non-stoichiometric silica material having a lower carbon content, and thence (i.e., after even more exposure to UV light) into substantially pure silica. The output power level after 1300 hours has stabilized at an intermediate level (in the depicted embodiment, 73%) higher than that exhibited during the burn-in procedure but lower than that exhibited by the device at initial power-on.

Figure 14:
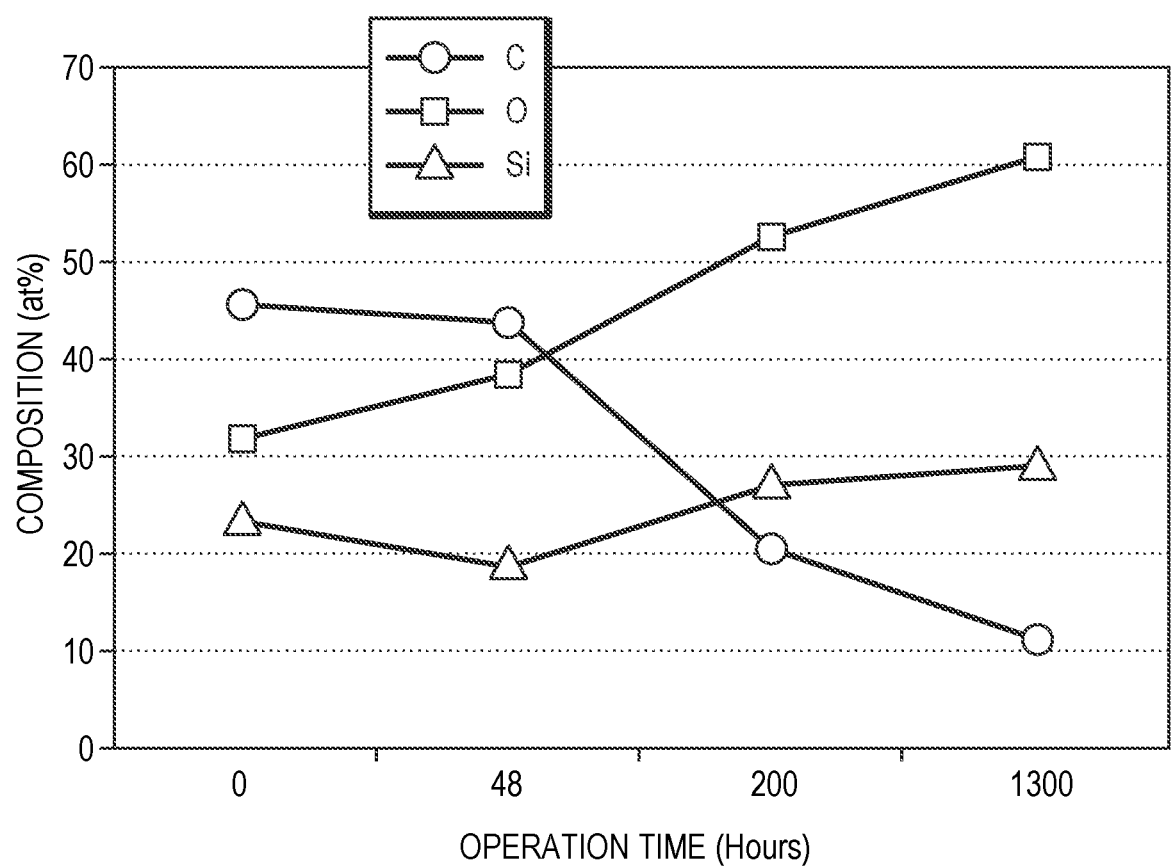
FIG. 14 is a graph of the approximate compositions of the encapsulants of FIGS. 13A-13D.

FIG. 14 plots the approximate composition of the encapsulant of FIGS. 13A-13D as a function of device operation (and thus UV exposure) time. As shown, as the device operation time approaches 1300 hours, the amount of oxygen increases, the amount of silicon slightly increases, and the amount of carbon diminishes. Notably, after 1300 hours, the oxygen content approaches the approximately 67% of pure silica while the silicon content approaches the 33% of pure silica. In FIGS. 13A-13D and 14, the sample exposed for 48 hours was exposed to UV light having a wavelength of 257 nm, the sample exposed for 200 hours was exposed to UV light having a wavelength of 279 nm, and the sample exposed for 1300 hours was exposed to UV light having a wavelength of 263 nm; these wavelengths are not limiting, and embodiments of the invention may utilize other wavelengths of UV light.

In some embodiments, particularly those in which the encapsulant has larger thicknesses, only the portion of the encapsulant closest to the light-emitting die is partially or substantially converted into non-stoichiometric silica material, leaving a second portion (closer to the rigid lens) substantially unconverted. In some embodiments, the encapsulant is exposed to UV light from sources other than the light-emitting die of the device in addition to or instead of the UV light from the light-emitting die. For example, UV light from other UV LEDs or UV lamps may be shone on the encapsulant from above, enhancing the conversion of the encapsulant into non-stoichiometric silica material and/or converting additional region(s) of the encapsulant into non-stoichiometric silica material.

Figure 15A:
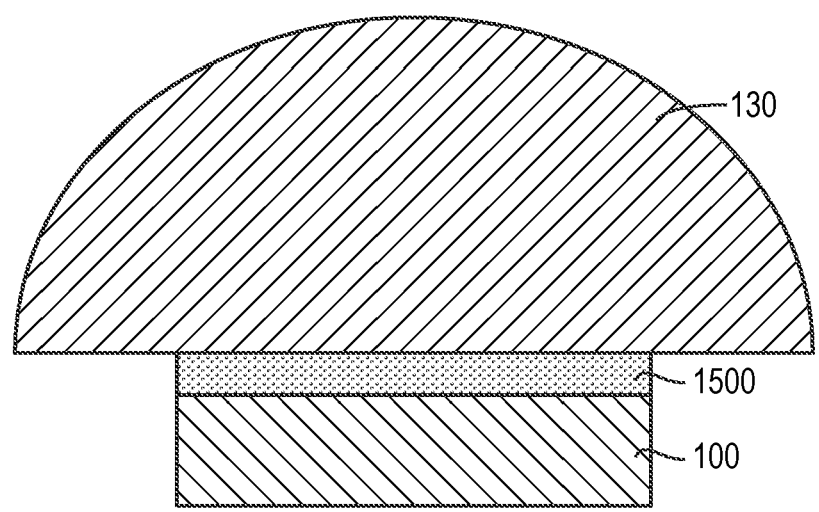
FIGS. 15A-15C are schematic cross-sections of devices incorporating encapsulants converted into non-stoichiometric silica material in accordance with various embodiments of the invention.
Figure 15B:
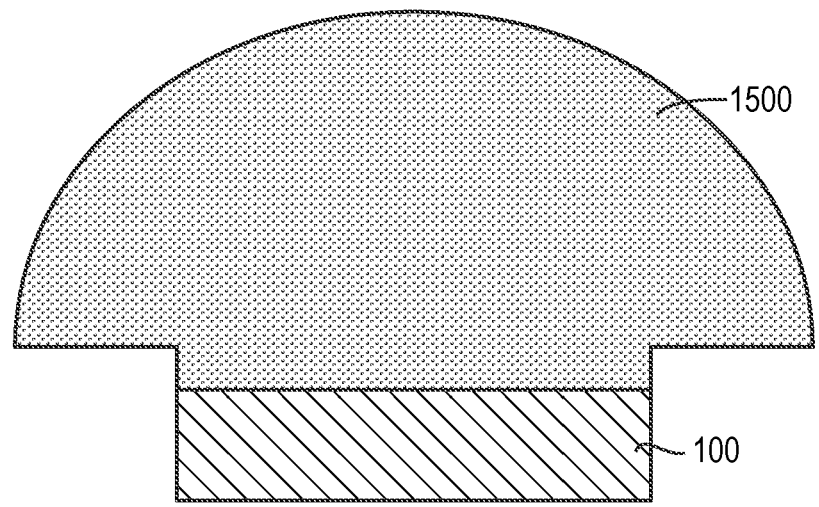
Figure 15C:
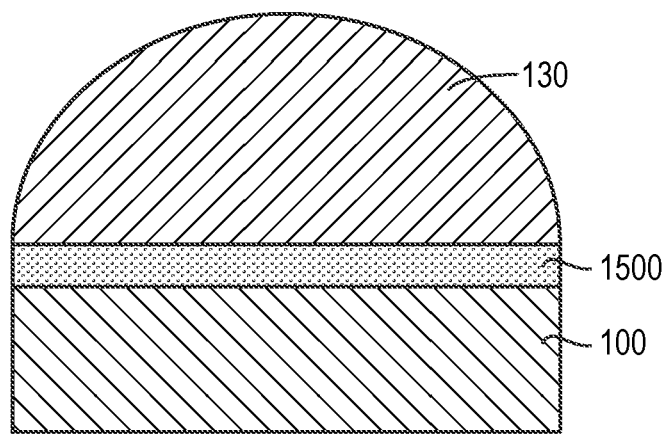

FIGS. 15A-15H depict UV light-emitting devices in accordance with various embodiments of the present invention. In each figure, the die 100 is topped with an encapsulant 1500 that has been partially or substantially fully converted into non-stoichiometric silica material via exposure to UV light. Various embodiments also incorporate a lens 130 as described above. The converted encapsulant 1500 typically contains carbon at levels greater than 1 ppm (or even greater than approximately 1 atomic %) but less than approximately 40 atomic %, less than approximately 30 atomic %, or even less than approximately 20 atomic %. As mentioned above, the lens 130 typically contains less than 1 ppm of carbon, or is substantially free of carbon. As shown in FIG. 15B, the encapsulant 1500 may be shaped into a lens shape and thus be utilized to replace the lens 130 present in some embodiments of the invention (see, e.g., FIG. 15A). As shown in FIG. 15C, the lens 130 (whether having a rounded shape or taking the form of a flat plate) does not necessarily overhang the sides of the die 100. In addition, as previously shown in FIGS. 1C and 1D, the lens 130 may include, consist essentially of, or consist of a flat plate that may be larger than the die (and thus, e.g., overhangs the die on at least one side) and that has been patterned or roughened to assist with photon extraction, for instance, a Fresnel lens.

Figure 15D:
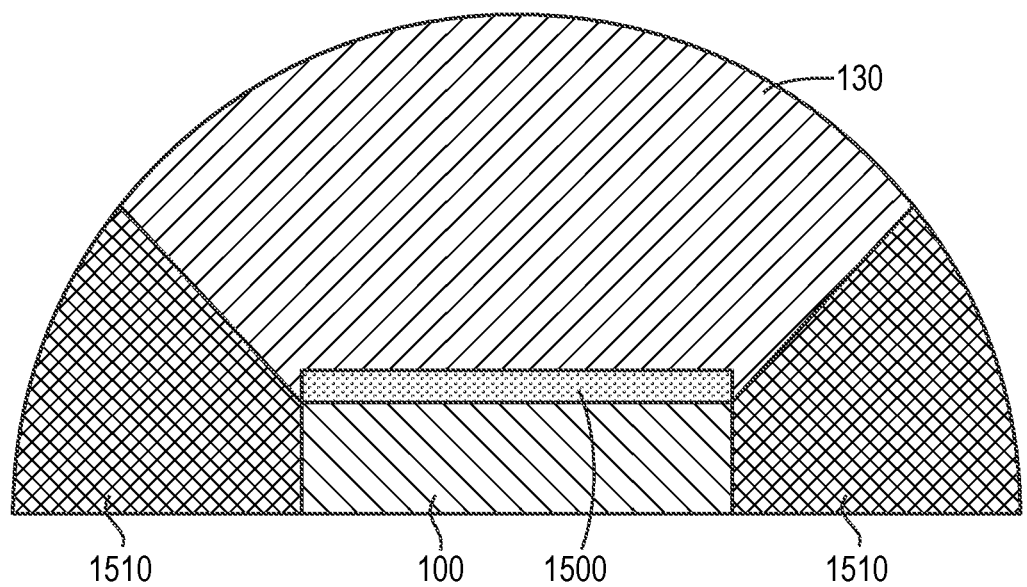
FIG. 15D is a schematic cross-section of a device incorporating an encapsulant converted into non-stoichiometric silica material, as well as unconverted encapsulant and/or barrier materials, in accordance with various embodiments of the invention.

FIG. 15D depicts an embodiment of the present invention in which the converted encapsulant 1500 and the lens 130 are disposed above the top surface of the die 100, while regions 1510 proximate the sides of die 100 may include, consist essentially of, or consist of unconverted encapsulant (i.e., encapsulant not exposed to UV light or exposed to UV light of insufficient power and/or duration to convert an appreciable amount of the encapsulant into non-stoichiometric silica material) and/or a barrier material that is opaque or reflective to the UV light emitted by die 100. For example, a barrier (e.g., a barrier including, consisting essentially of, or consisting of Al and/or another UV-reflective material such as polytetrafluoroethylene (PTFE)) may be disposed between the sidewalls of the die 100 and the remaining portions of regions 1510 (as detailed in the '655 application), which are thus shielded from appreciable exposure to UV light emitted by die 100 and remain unconverted.

Figure 15E:
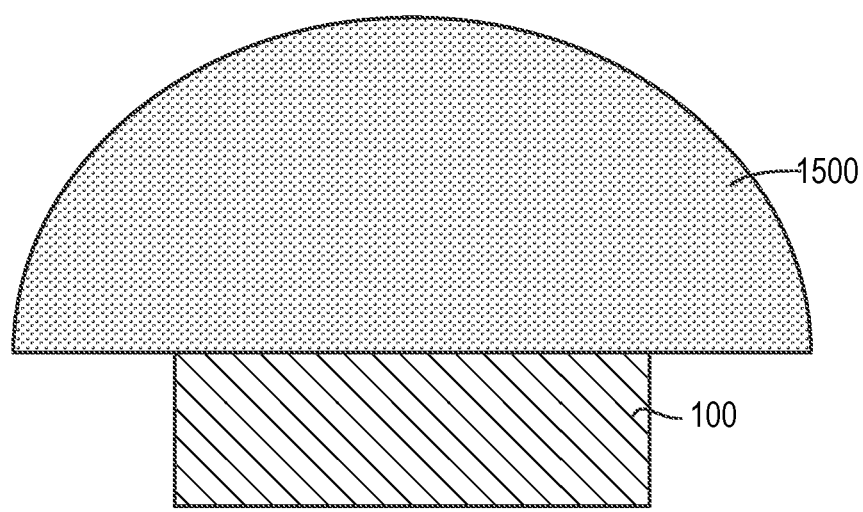
FIGS. 15E and 15F are schematic cross-sections of devices incorporating encapsulants converted into non-stoichiometric silica material in accordance with various embodiments of the invention.
Figure 15F:
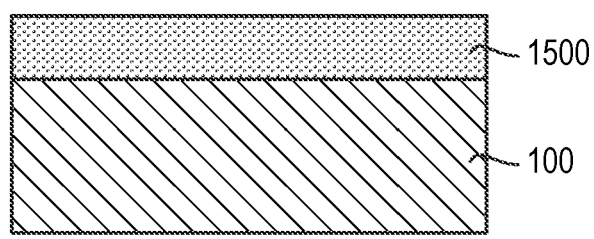
Figure 15G:
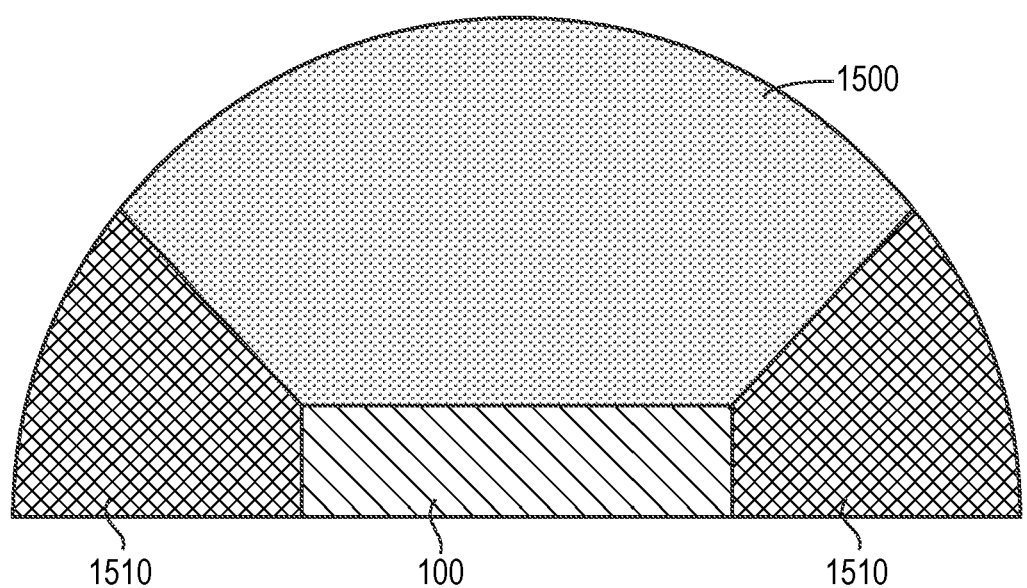
FIG. 15G is a schematic cross-section of a device incorporating an encapsulant converted into non-stoichiometric silica material, as well as unconverted encapsulant and/or barrier materials, in accordance with various embodiments of the invention.
Figure 15H:
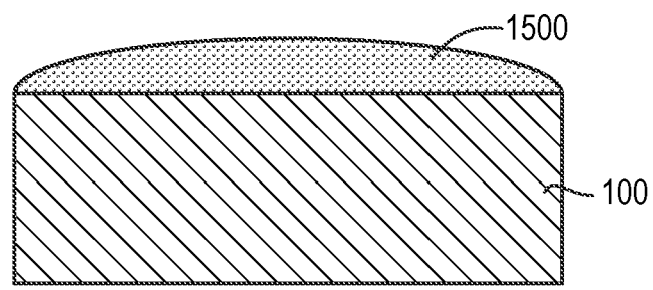
FIG. 15H is a schematic cross-section of a device incorporating an encapsulant converted into non-stoichiometric silica material in accordance with various embodiments of the invention.

As shown in FIGS. 15E and 15F, the converted encapsulant 1500 may be shaped (e.g., by molding) into various shapes (e.g., a hemispherical lens or a flat plate) before or after it is disposed on the die 100. For example, in some embodiments the encapsulant is molded into a desired shape and exposed to UV light before it is attached to the die 100. FIG. 15H depicts an embodiment in which the converted encapsulant has a curved top surface and otherwise conforms to the top surface of the die 100. FIG. 15G is similar to FIG. 15D, but the lens 130 has been replaced by a region including, consisting essentially of, or consisting of the converted encapsulant 1500. As shown, the device may still incorporate regions 1510 that include, consist essentially of, or consist of unconverted encapsulant and/or a barrier to UV light. As detailed above, one or more barrier materials may separate the die 100 from the unconverted regions 1510.

Figure 16:
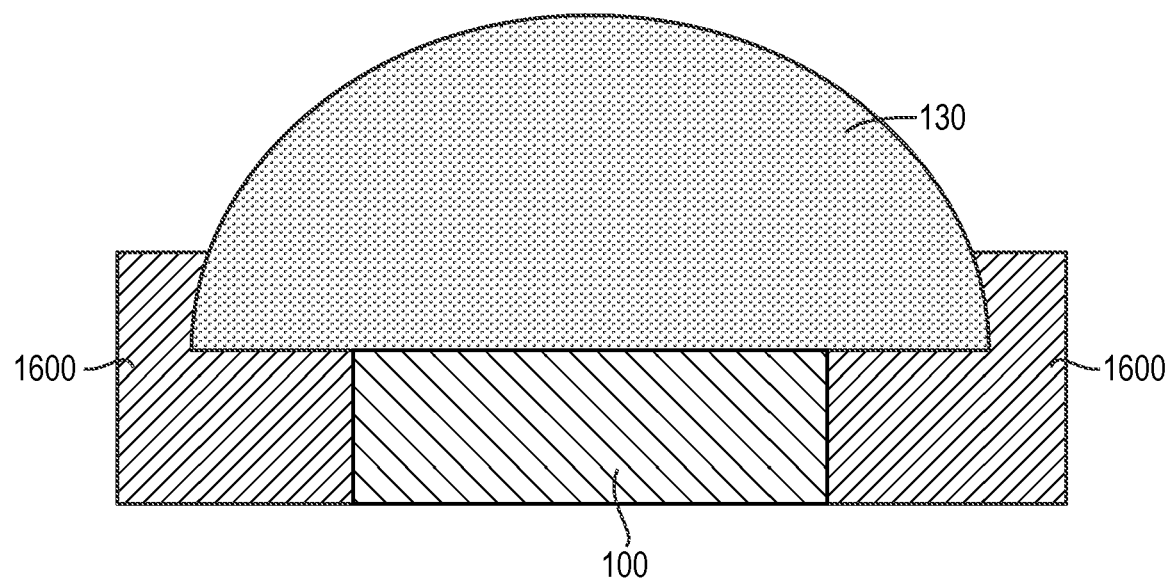
FIG. 16 is a schematic cross-section of a device incorporating a rigid lens and an attachment material in accordance with various embodiments of the invention.

In some embodiments, the conversion of the encapsulant embrittles the converted encapsulant 1500, and thus the lens 130 may be more likely to loosen or become detached from the light-emitting die 100. In such embodiments, an additional attachment agent or attachment material 1600 may be utilized to further secure the lens in contact with the die, as shown in FIG. 16. For example, the attachment agent 1600 may be a resin (e.g., an epoxy resin that may be opaque) in which the device is partially immersed. In other embodiments, the attachment agent 1600 includes or consists essentially of a clamp or other mechanical fastener that maintains contact between the lens 130 and the die 100 (or the embrittled encapsulant 1510). The attachment agent 1600 may extend at least slightly (e.g., approximately 0.5 mm or less, or approximately 0.3 mm or less, or approximately 0.1 mm or less) above the interface between the die 100 (or the embrittled encapsulant 1510) and the lens 130 in order to further stabilize the lens during device operation and handling. The thin layer of converted encapsulant 1510 between the die 100 and the lens 130 is omitted from FIG. 16 for clarity. In various embodiments, the attachment agent 1600 does not extend appreciably (e.g., not by more than 0.5 mm) above the bottom surface of the lens 130 so as not to block emission of UV light from the device and deleteriously impact output power of the device.

In various embodiments of the invention, after the burn-in period exposing the organic encapsulant to UV light (i.e., from the light-emitting die itself and/or from a secondary, extrinsic source other than the die, for a time period of, e.g., approximately 100 to approximately 300 hours), any remaining portion of the manufacturing process of the UV device is completed and the device may be shipped to a customer and/or incorporated into a larger system or device that utilizes the UV light emitted by the light-emitting die. For example, the UV device may be subjected to quality-control checks and/or binned by, for example, output power and/or emission wavelength. The device may be incorporated into a larger system that advantageously uses the emitted UV light by the device fabricator or by a third-party customer to whom the device is transferred (e.g., sold and shipped). For example, the larger system may include or consist essentially of a disinfection, purification, and/or biocidal system for liquids and/or gases, a medical device, an imaging system (e.g., an anti-counterfeiting system for examination of watermarks on currency), a UV curing system, a printing systems, an optical sensor, etc.

In various embodiments of the invention, after the burn-in period exposing the organic encapsulant to UV light, the output power of the devices is measured in order to enable rejection of devices exhibiting less output power than a criterion (i.e., than a predetermined minimum desired output power). This measurement step is typically performed as a test in the manufacturing process before the devices are shipped to customers. Approximately 20% to approximately 40% of the burned-in devices may show lower output power than the minimum output power criterion due to, for example, variability of the conversion of organic encapsulant into non-stoichiometric silica during the burn-in period. That is, during or after the burn-in procedure detailed herein, some percentage of the devices may exhibit power degradation, although the majority of the devices maintain output powers nearly equal to the output powers before burn-in. Therefore, the test step following the burn-in procedure may advantageously be utilized to eliminate (e.g., remove from a shipment to a customer) low-output-power devices that do not meet product specifications.

Furthermore, various embodiments of the invention may utilize, during the burn-in conversion procedure, one or more operating conditions different from those to be utilized by the light-emitting device during normal operation (i.e., operation by a customer and/or operation within a larger device advantageously utilizing the UV light emitted by the device). For example, a higher current or higher temperature condition than those recommended as maximum operation conditions may be applied in the burn-in step in order to accelerate the conversion into non-stoichiometric silica material. In one exemplary embodiment, while the maximum recommended operating current of a UV light-emitting device is 300 mA, a larger current (e.g., 400 mA) may be applied for all or part of the burn-in procedure (e.g., for 100 hours) to facilitate the conversion of the organic encapsulant material. In another exemplary embodiment, while the recommended maximum case temperature of a UV light-emitting device is 55° C., a case temperature higher than the recommended maximum (e.g., 85° C.) may be applied during all or part of the burn-in procedure to facilitate the conversion of the organic encapsulant material.

Another operating condition that may be varied during the burn-in procedure from that utilized during normal operation is the oxygen concentration in the atmosphere surrounding the light-emitting device. For example, the burn-in procedure may be performed under an atmosphere having a higher oxygen concentration atmosphere than that utilized during normal operation (e.g., atmospheric air). As detailed herein, in various embodiments of the present invention the organic encapsulant is converted into non-stoichiometric silica material via a photochemical oxidation reaction; thus, introducing excessive oxygen as an oxidant promotes the conversion reaction. In various embodiments, the atmosphere in which the burn-in procedure is performed may include more than 30% oxygen up to 100% of oxygen.

In various embodiments of the invention, silicone resin is used as the UV-transparent encapsulant. In such cases, the photochemical reaction that enables conversion of silicone into non-stoichiometric silica material may form formaldehyde as a byproduct. Therefore, various embodiments of the invention balance the generation of the byproduct formaldehyde and the outward diffusion of the formaldehyde, because accumulation of formaldehyde may result in formation of bubbles (e.g., having a size of a few nanometers to tens of microns) that may block or deflect UV light emitted by the semiconductor die, decreasing device efficiency. If diffusion of formaldehyde being generated during the burn-in procedure is much slower than formation of the formaldehyde, the conversion process may be more unstable due to accumulation of formaldehyde in the non-stoichiometric silica material. Thus, in such cases, all or part of the burn-in procedure may be performed utilizing operating currents and/or temperatures lower than those recommended for nominal device operation (i.e., by a customer). In an exemplary embodiment, for devices with recommended operating current of 300 mA, a lower current of, e.g., 20 mA to 150 mA may be utilized for all or part of the burn-in procedure to reduce the formation rate of formaldehyde and consequently avoid accumulation of formaldehyde that might detrimentally impact light output power.

In other embodiments, the diffusion of formaldehyde is enhanced in order to avoid accumulation of formaldehyde generated in the burn-in procedure. As described above, a higher case temperature (i.e., the temperature applied to the semiconductor die and/or part or all of its packaging, such as a submount) may increase the rate of diffusion of the formaldehyde out of the encapsulant undergoing conversion. In addition or alternatively, all or part of the burn-in procedure may be performed in a vacuum atmosphere in order to promote diffusion of the formaldehyde byproduct out of the unconverted and/or converted encapsulant.

In various other embodiments, the rate of the photochemical conversion reaction is reduced to increase the diffusion of formaldehyde relative to its formation by limiting oxygen concentration in the encapsulant. For oxidation reactions, oxygen may be utilized as an oxidant. Sources of oxygen include oxygen molecules dissolved in the encapsulant material and/or oxygen molecules being diffused inward from the atmosphere during burn-in. In various embodiments, limiting oxygen concentration in the encapsulant is effective in reducing the rate of photochemical reaction. In such embodiments, oxygen concentration in the encapsulant is limited to between 0.1 ppm to 1 atomic %. To attain such low oxygen concentrations, preparation of the encapsulant material, including any kneading steps, may be performed under a low-oxygen atmosphere (e.g., an atmosphere containing between 0% and 10% oxygen), e.g., under a substantially pure nitrogen (or inert gas) atmosphere.

In various embodiments of the present invention, particularly when the output power of the light-emitting device before burn-in is greater than 15 mW, the device may exhibit an output power recovery phenomenon. In such a recovery phenomenon, the output power may initially decrease during the first stages of the burn-in but then increase during later stages of the burn-in. Although the inventors do not wish to be bound by, and embodiments of the invention are not limited by, the mechanism for the recovery, the following describes one possible mechanism. In the initial stages of the burn-in, formaldehyde accumulation may cause a decrease in output power due to bubble formation. At a later stage of burn-in, as the photochemical reaction dwindles as the conversion of the encapsulant is completed, outward diffusion of formaldehyde becomes relatively faster than formation of the formaldehyde, resulting in elimination of bubbles including or consisting essentially of formaldehyde gas, thereby enabling the output power recovery. Therefore, embodiments of the invention monitor the output power of the device during the burn-in procedure and utilize burn-in times longer than that required for the output power of the device to recover to a level close to (e.g., approximately 80% to approximately 100%) the initial output power level when the burn-in commences. The burn-in period that enables recovery may depend on the output power of the device undergoing burn-in. For example, a device having an output power of 20 mW before burn-in may utilize a burn-in of at least 200 hours, while a device having an output power of 15 mW may utilize a burn-in of at least 300 hours.

Example 1

Silicone resin was utilized as an organic encapsulant and dispensed over a UV LED die in a lead-frame package. A rigid hemispherical lens composed of fused silica was attached to the die via application of force sufficient to minimize the thickness of silicone resin between the lens and the die. The device with the silicone resin and the lens was place in a vacuum oven under 10 Torr of vacuum at room temperature for 10 minutes to remove any air trapped in the silicone resin. The device was baked in an oven at approximately 150° C. for approximately 1 hour in order to cure the silicone resin. In this example, the resulting thickness of the silicone resin was approximately 8 µm. Epoxy resin was dispensed as an attachment material, filling the lead-frame cavity, covering the wire bonds to the LED die, and slightly overlapping, and extending over, the bottom surface of the rigid lens. The device was then baked in an oven at 160° C. for 1 hour to cure the epoxy resin. The top surface of the cured epoxy resin extended above the bottom surface of the rigid lens by 0.2 mm. The silicone resin was exposed to UV light having a wavelength of 265 nm emitted by the LED die for 200 hours to convert the silicone resin into non-stoichiometric silica material. The carbon content of the resulting non-stoichiometric silica material was about 20 atomic %.

Example 2

Silicone resin was utilized as an organic encapsulant and dispensed over a UV LED die in a lead-frame package. A rigid hemispherical lens composed of fused silica was attached to the die via application of force sufficient to minimize the thickness of silicone resin between the lens and the die. The device with the silicone resin and the lens was place in a vacuum oven under 10 Torr of vacuum at room temperature for 10 minutes to remove any air trapped in the silicone resin. The device was baked in an oven at approximately 150° C. for approximately 1 hour in order to cure the silicone resin. In this example, the resulting thickness of the silicone resin was approximately 8 µm. The silicone resin was exposed to UV light having a wavelength of 265 nm emitted by the LED die for 200 hours to convert the silicone resin into non-stoichiometric silica material. The carbon content of the resulting non-stoichiometric silica material was about 20 atomic %.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An illumination device comprising:
an ultraviolet (UV) light-emitting semiconductor die; and
a layer of non-stoichiometric silica material disposed over and/or around the semiconductor die,
wherein the non-stoichiometric silica material comprises silicon, oxygen, and carbon, a carbon content of the non-stoichiometric silica material being greater than 1 ppm and less than 40 atomic percent.

2. The illumination device of claim 1, wherein the carbon content of the non-stoichiometric silica material is greater than 1 atomic percent.

3. The illumination device of claim 1, wherein the carbon content of the non-stoichiometric silica material is less than 20 atomic percent.

4. The illumination device of claim 1, wherein the layer of non-stoichiometric silica material is disposed over a top surface of the semiconductor die, and further comprising a barrier material disposed proximate a sidewall of the semiconductor die, the barrier material being opaque to UV light.

5. The illumination device of claim 4, wherein the barrier material comprises aluminum, polytetrafluoroethylene, and/or an opaque resin.

6. The illumination device of claim 1, wherein the non-stoichiometric silica material consists of silicon, oxygen, and carbon.

7. The illumination device of claim 1, wherein the non-stoichiometric silica material is shaped as a lens.

8. The illumination device of claim 1, wherein the non-stoichiometric silica material is shaped as a flat plate.

9. The illumination device of claim 1, wherein the non-stoichiometric silica material comprises therewithin a plurality of scattering centers each having a refractive index different from a refractive index of the non-stoichiometric silica material.

10. The illumination device of claim 1, further comprising an attachment material disposed around at least a portion of the semiconductor die and around at least a portion of the non-stoichiometric silica material.

11. The illumination device of claim 10, wherein the attachment material comprises a resin.

12. The illumination device of claim 10, wherein the attachment material is opaque to UV light.

13. The illumination device of claim 10, wherein the attachment material comprises at least one of a mechanical fastener or a clamp.

14. An illumination device comprising:
an ultraviolet (UV) light-emitting semiconductor die; and
a layer of encapsulant disposed over and/or around the semiconductor die,
wherein (i) a first portion of the layer of encapsulant comprises a non-stoichiometric silica material, (ii) a second portion of the layer of encapsulant comprises silicone, and (iii) the non-stoichiometric silica material comprises silicon, oxygen, and carbon, a carbon content of the non-stoichiometric silica material being greater than 1 ppm and less than 40 atomic percent.

15. The illumination device of claim 14, wherein the carbon content of the non-stoichiometric silica material is greater than 1 atomic percent.

16. The illumination device of claim 14, wherein the carbon content of the non-stoichiometric silica material is less than 20 atomic percent.

17. The illumination device of claim 14, wherein the first portion of the layer of encapsulant is disposed over a top surface of the semiconductor die and the second portion of the layer of encapsulant is disposed proximate a sidewall of the semiconductor die.

18. The illumination device of claim 17, further comprising a barrier material between the sidewall of the semiconductor die and the second portion of the layer of encapsulant, the barrier material being opaque to UV light.

19. The illumination device of claim 18, wherein the barrier material comprises aluminum, polytetrafluoroethylene, and/or an opaque resin.

20. The illumination device of claim 14, wherein the non-stoichiometric silica material consists of silicon, oxygen, and carbon.

21. The illumination device of claim 14, wherein the non-stoichiometric silica material consists essentially of silicon, oxygen, and carbon.

22. The illumination device of claim 14, further comprising a lens disposed over at least a portion of the layer of encapsulant.

23. The illumination device of claim 22, wherein the lens comprises at least one of fused silica, quartz, or sapphire.

24. The illumination device of claim 14, wherein the carbon content of the non-stoichiometric silica material is less than 30 atomic percent.

25. The illumination device of claim 1, wherein the non-stoichiometric silica material consists essentially of silicon, oxygen, and carbon.

26. The illumination device of claim 1, further comprising a lens disposed over at least a portion of the layer of non-stoichiometric silica material.

27. The illumination device of claim 26, wherein the lens comprises at least one of fused silica, quartz, or sapphire.

28. The illumination device of claim 1, wherein the carbon content of the non-stoichiometric silica material is less than 30 atomic percent.

* * * * *